United States Patent
Takano et al.

(10) Patent No.: US 11,181,557 B2
(45) Date of Patent: Nov. 23, 2021

(54) MAGNETIC SENSOR DEVICE AND CURRENT SENSOR

(71) Applicant: TDK CORPORATION, Tokyo (JP)

(72) Inventors: Kenichi Takano, Tokyo (JP); Yuta Saito, Tokyo (JP); Suguru Watanabe, Tokyo (JP)

(73) Assignee: TDK CORPORATION, Tokyo (JP)

( * ) Notice: Subject to any disclaimer, the term of this patent is extended or adjusted under 35 U.S.C. 154(b) by 59 days.

(21) Appl. No.: 16/101,820

(22) Filed: Aug. 13, 2018

(65) Prior Publication Data
US 2019/0086447 A1    Mar. 21, 2019

(30) Foreign Application Priority Data

Sep. 15, 2017    (JP) ............................ JP2017-177331

(51) Int. Cl.
   *G01R 15/20* (2006.01)
   *G01R 33/09* (2006.01)
   *G01R 19/00* (2006.01)
   *G01R 33/00* (2006.01)

(52) U.S. Cl.
   CPC ......... *G01R 15/205* (2013.01); *G01R 15/207* (2013.01); *G01R 19/0092* (2013.01); *G01R 33/0076* (2013.01); *G01R 33/09* (2013.01)

(58) Field of Classification Search
   CPC .. G01R 15/205; G01R 33/0076; G01R 33/09; G01R 19/0092; G01R 15/207; G01R 33/093; G01R 33/063; G01R 33/04
   See application file for complete search history.

(56) References Cited

U.S. PATENT DOCUMENTS

| 8,754,642 B2 | 6/2014 | Ide et al. |
| 2011/0221434 A1* | 9/2011 | Nishiyama ........... G01R 15/205 324/252 |
| 2012/0326715 A1 | 12/2012 | Ide et al. |
| 2013/0057273 A1* | 3/2013 | Ide ...................... G01R 33/093 324/252 |

(Continued)

FOREIGN PATENT DOCUMENTS

| CN | 102812376 A | 12/2012 |
| JP | 2013-053903 A | 3/2013 |

(Continued)

OTHER PUBLICATIONS

English Machine Translation of Ohmori et al. WO 2013/176271 (Year: 2013).*

(Continued)

*Primary Examiner* — Lee E Rodak
(74) *Attorney, Agent, or Firm* — Oliff PLC

(57) ABSTRACT

A current sensor includes a magnetic sensor device. The magnetic sensor device includes a magnetic sensor, a first magnetic layer, and a second magnetic layer in non-contact with the first magnetic layer. The magnetic sensor, the first magnetic layer, and the second magnetic layer are disposed across a virtual straight line and arranged in this order in a direction parallel to the virtual straight line. Different portions of magnetic flux generated by a current to be detected pass through the magnetic sensor, the first magnetic layer, and the second magnetic layer.

23 Claims, 12 Drawing Sheets

(56) References Cited

U.S. PATENT DOCUMENTS

| | | | |
|---|---|---|---|
| 2015/0177285 A1* | 6/2015 | Higashi | G01R 19/0092 |
| | | | 324/144 |
| 2015/0177286 A1* | 6/2015 | Fuji | G01R 33/0005 |
| | | | 324/144 |
| 2019/0293733 A1* | 9/2019 | Esaka | G01R 33/0017 |

FOREIGN PATENT DOCUMENTS

| | | | |
|---|---|---|---|
| JP | 2017-078577 A | 4/2017 | |
| WO | 2013/176271 A1 | 11/2013 | |
| WO | WO-2013176271 A1 * | 11/2013 | G01R 15/205 |

OTHER PUBLICATIONS

Nov. 19, 2019 Office Action issued in Japanese Patent Application No. 2017-177331.

Sep. 2, 2020 Office Action issued in Chinese Patent Application No. 201811074434.0 (translation only).

K. Xu et al., "Sensor Practical Technology," National Defense Industry Press, Dec. 2016, 3 pages.

\* cited by examiner

MAGNETIC SENSOR DEVICE AND CURRENT SENSOR

BACKGROUND OF THE INVENTION

1. Field of the Invention

The present invention relates to a current sensor, and a magnetic sensor device for use in the current sensor.

2. Description of the Related Art

Magnetic balance type current sensors, such as one disclosed in U.S. Pat. No. 8,754,642 B2, are known as current sensors that are capable of accurately detecting the value of a current to be detected flowing through a conductor. In general, a magnetic balance type current sensor includes a feedback coil, a magnetic sensor, a feedback circuit, and a current detector. The feedback coil is intended to generate a second magnetic field that cancels out a first magnetic field generated by the current to be detected flowing through the conductor. The magnetic sensor detects a composite magnetic field of the first and second magnetic fields as a magnetic field to be detected, and generates a magnetic-field detection value that depends on the strength of the magnetic field to be detected. The feedback circuit controls, in accordance with the magnetic-field detection value, a feedback current for generating the second magnetic field, and passes the feedback current through the feedback coil. The current detector generates a detection value of the feedback current. An example of the current detector is a resistor inserted to a current path of the feedback current. A potential difference across the resistor corresponds to the detection value of the feedback current. The detection value of the feedback current generated by the current detector will hereinafter be referred to as a current detection value. The current detection value is in proportion to the value of the current to be detected. The current detection value thus corresponds to a detection value of the current to be detected. The magnetic balance type current sensor operates so that the magnetic field to be detected by the magnetic sensor approaches zero.

The magnetic balance type current sensor described in U.S. Pat. No. 8,754,642 B2 includes a magnetic shield. The magnetic shield serves to reduce the absolute value of the first magnetic field relative to the case where there is no magnetic shield. This makes it possible to extend the range of detectable values of the current to be detected relative to the case where there is no magnetic shield.

JP 2017-078577A describes a current sensor that includes a first shield material having a first flat part, a second shield material having a second flat part opposed to the first flat part, a bus bar provided between the first shield material and the second shield material, and a detecting element provided between the first flat part and the bus bar. The first shield material has a wall part surrounding the first flat part one round.

A magnetic shield in a current sensor has a hysteresis property. Therefore, once the magnetic shield has been magnetized by an applied magnetic field, a certain amount of magnetization remains, even after the applied magnetic field has disappeared, in the magnetic shield in the direction in which the magnetic shield has been magnetized by the applied magnetic field. The current sensor having the magnetic shield has a problem that the hysteresis property of the magnetic shield can cause an error in the current detection value.

The current sensor described in JP 2017-078577A requires that a part of the bus bar be located between the first shield material and the second shield material, thus having a disadvantage that the current sensor cannot be configured independently of the bus bar.

SUMMARY OF THE INVENTION

It is an object of the present invention to provide a current sensor and a magnetic sensor device for use in the current sensor that enable extension of a range of detectable values of a current to be detected and reduction of an error occurring in a current detection value.

A magnetic sensor device of the present invention is for use in a current sensor for detecting a value of a current to be detected. The magnetic sensor device of the present invention includes a magnetic sensor, a first magnetic layer, and a second magnetic layer in non-contact with the first magnetic layer. The magnetic sensor, the first magnetic layer, and the second magnetic layer are disposed across a virtual straight line and arranged in this order in a first direction parallel to the virtual straight line so that different portions of magnetic flux generated by the current to be detected pass through the magnetic sensor, the first magnetic layer, and the second magnetic layer.

A current sensor of the present invention includes: a coil for generating a second magnetic field for canceling out a first magnetic field generated by a current to be detected; a magnetic sensor for detecting a composite magnetic field of the first and second magnetic fields as a magnetic field to be detected, and generating a magnetic-field detection value dependent on a strength of the magnetic field to be detected; a feedback circuit for controlling, in accordance with the magnetic-field detection value, a feedback current to be used to generate the second magnetic field, and passing the feedback current through the coil; a current detector for generating a detection value of the feedback current; a first magnetic layer; and a second magnetic layer in non-contact with the first magnetic layer. The magnetic sensor, the first magnetic layer, and the second magnetic layer are disposed across a virtual straight line and arranged in this order in a first direction parallel to the virtual straight line so that different portions of magnetic flux generated by the current to be detected pass through the magnetic sensor, the first magnetic layer, and the second magnetic layer.

In the magnetic sensor device and the current sensor of the present invention, the magnetic sensor may include a magnetoresistive element.

In the magnetic sensor device and the current sensor of the present invention, the magnetic sensor may be configured to detect a magnetic field in a second direction orthogonal to the first direction. Each of the first magnetic layer and the second magnetic layer has a first dimension in the first direction, and a second dimension in the second direction. The second dimension may be greater than the first dimension. The first magnetic layer may be smaller in the second dimension than the second magnetic layer. The first magnetic layer may be smaller in volume than the second magnetic layer. In this case, the first magnetic layer may be smaller in at least one of the first and second dimensions than the second magnetic layer.

In the magnetic sensor device and the current sensor of the present invention, each of the first magnetic layer and the second magnetic layer may have a first dimension in the first direction, a second dimension in the second direction, and a third dimension in a third direction orthogonal to the first and second directions. The third dimension may be greater than the second dimension. The third dimension of the first magnetic layer may be smaller than or equal to the third dimension of the second magnetic layer.

In the magnetic sensor device and the current sensor of the present invention, the first magnetic layer may be lower in coercivity than the second magnetic layer.

In the magnetic sensor device of the present invention, the magnetic sensor, the first magnetic layer, and the second magnetic layer may be integrated with each other and independent of a conductor through which the current to be detected flows.

In the current sensor of the present invention, the coil may be located on an opposite side of the first magnetic layer from the second magnetic layer.

In the current sensor of the present invention, the coil, the magnetic sensor, the first magnetic layer, and the second magnetic layer may be integrated with each other and independent of a conductor through which the current to be detected flows.

According to the magnetic sensor device and the current sensor of the present invention, the provision of the first magnetic layer and the second magnetic layer makes it possible to reduce the absolute value of a magnetic field that is generated by a current to be detected and is applied to the magnetic sensor, thereby enabling extension of a range of detectable values of the current to be detected.

Further, according to the magnetic sensor device and the current sensor of the present invention, the magnetic sensor, the first magnetic layer and the second magnetic layer are arranged in this order in the first direction parallel to the virtual straight line. This enables reduction of an error occurring in the current detection value.

Other and further objects, features and advantages of the present invention will appear more fully from the following description.

DETAILED DESCRIPTION OF THE PREFERRED EMBODIMENT

Figure 1:
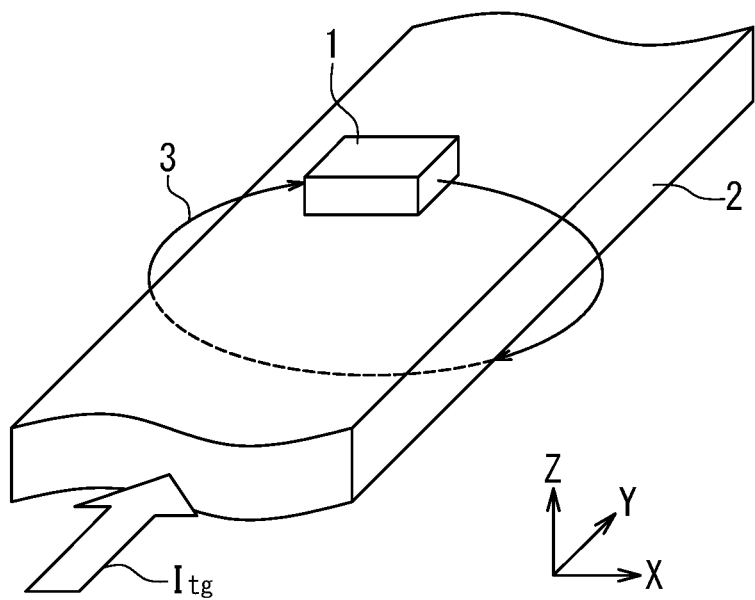
FIG. 1 is a perspective view illustrating the configuration of a system including a current sensor according to an embodiment of the invention.

A preferred embodiment of the present invention will now be described in detail with reference to the drawings. First, reference is made to FIG. 1 to describe the configuration of a system including a current sensor according to the embodiment of the invention. The current sensor 1 according to the embodiment is to detect the value of a current to be detected flowing through a conductor. FIG. 1 illustrates an example in which the conductor through which the current to be detected flows is a bus bar 2. The current sensor 1 is disposed near the bus bar 2. Hereinafter, the current to be detected will be referred to as target current Itg. The target current Itg generates a magnetic field 3 around the bus bar 2. The current sensor 1 is disposed at a position where the magnetic field 3 is applied.

Figure 2:
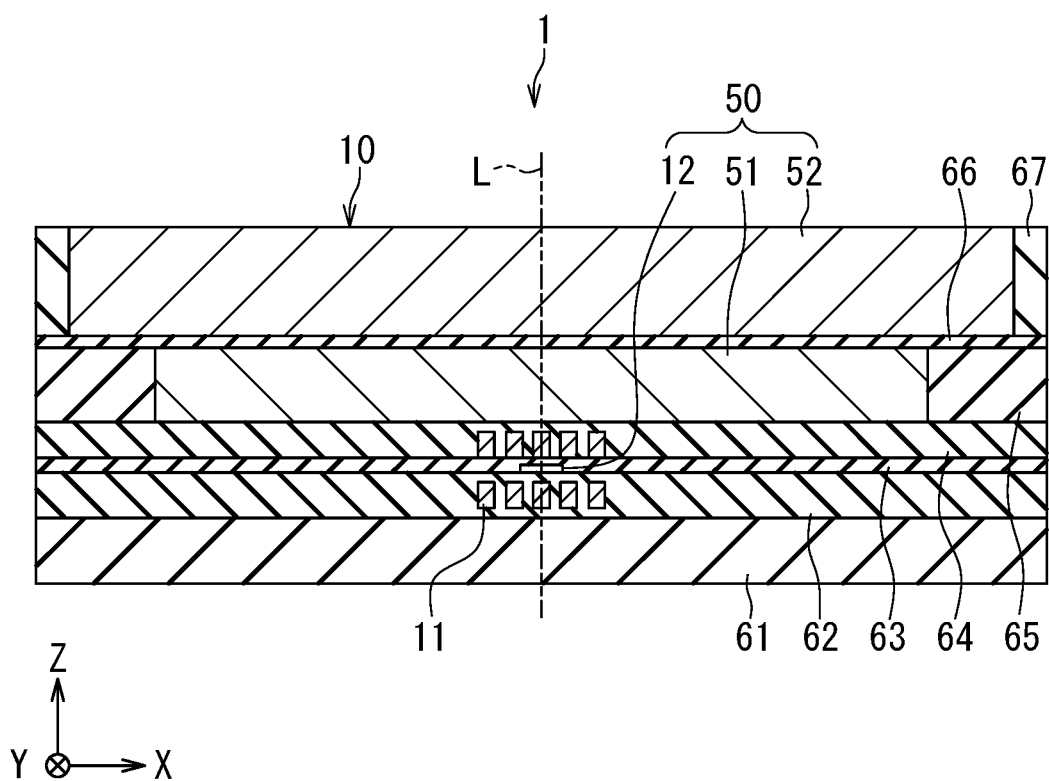
FIG. 2 is a cross-sectional view of a main body of the current sensor according to the embodiment of the invention.

The configuration of the current sensor 1 will now be described. First, a description will be given of a main body 10 of the current sensor 1. FIG. 2 is a cross-sectional view of the main body 10 of the current sensor 1. The current sensor 1 is a magnetic balance type current sensor. As shown in FIG. 2, the current sensor 1 includes a coil 11, a magnetic sensor 12, a first magnetic layer 51, and a second magnetic layer 52. The coil 11, the magnetic sensor 12, the first magnetic layer 51 and the second magnetic layer 52 are integrated with each other by a plurality of nonmagnetic layers, which will be described later, to constitute the main body 10 of the current sensor 1. The first magnetic layer 51 and the second magnetic layer 52 are separated from each other by a nonmagnetic layer. The main body 10 of the current sensor 1 is independent of the bus bar 2.

A magnetic sensor device 50 according to this embodiment includes the magnetic sensor 12, the first magnetic layer 51, and the second magnetic layer 52. The main body 10 of the current sensor 1 includes the magnetic sensor device 50 according to the embodiment.

Now, we define X, Y and Z directions as shown in FIG. 1 and FIG. 2. The X, Y and Z directions are orthogonal to one another. In this embodiment, the target current Itg shown in FIG. 1 flows in the Y direction. The opposite directions to the X, Y, and Z directions will be referred to as −X, −Y, and −Z directions, respectively. As used herein, the term "above" refers to positions located forward of a reference position in the Z direction, and "below" refers to positions located on a side of the reference position opposite to "above".

The main body 10 of the current sensor 1 is disposed above or below the bus bar 2. The following illustrates an example in which the main body 10 is disposed above the bus bar 2.

Assume here that there is a virtual straight line L parallel to the Z direction, as shown in FIG. 2. The magnetic sensor 12, the first magnetic layer 51, and the second magnetic layer 52 are disposed across the virtual straight line L and arranged in this order in a direction parallel to the Z direction. A direction parallel to the Z direction is also a direction parallel to the virtual straight line L, and corresponds to the first direction in the present invention. The coil 11 is located on an opposite side of the first magnetic layer 51 from the second magnetic layer 52. In this embodiment, the second magnetic layer 52 is located above the first magnetic layer 51, whereas the coil 11 and the magnetic sensor 12 are located below the first magnetic layer 51.

Figure 3:
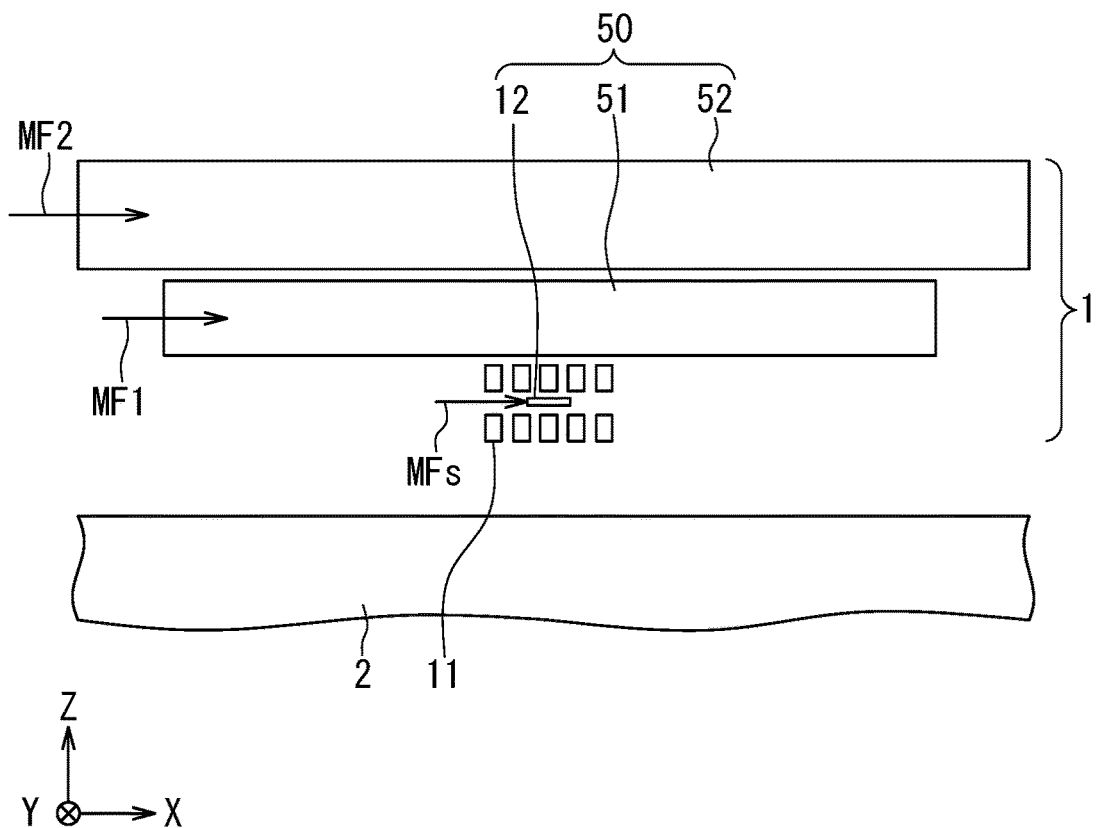
FIG. 3 is an explanatory diagram for explaining magnetic flux passing through the main body of the current sensor according to the embodiment of the invention.

The magnetic sensor 12, the first magnetic layer 51, and the second magnetic layer 52 are disposed and arranged in the above-described manner so that different portions of magnetic flux generated by the target current Itg pass through the magnetic sensor 12, the first magnetic layer 51, and the second magnetic layer 52. FIG. 3 is an explanatory diagram for explaining magnetic flux passing through the main body 10 of the current sensor 1. In FIG. 3, the arrow labeled MFs represents a magnetic flux passing through the magnetic sensor 12, the arrow labeled MF1 represents a magnetic flux passing through the first magnetic layer 51, and the arrow labeled MF2 represents a magnetic flux passing through the second magnetic layer 52. Each of the magnetic fluxes MFs, MF1, and MF2 is a portion of the magnetic flux generated by the target current Itg.

A portion of the magnetic field 3 generated by the target current Itg that is detectable by the magnetic sensor 12 will be referred to as the first magnetic field H1. The first and second magnetic layers 51 and 52 have the function of partly capturing the magnetic flux generated by the target current Itg and thereby reducing the absolute value of the first magnetic field H1 relative to the case without the first and second magnetic layers 51 and 52.

Figure 4:
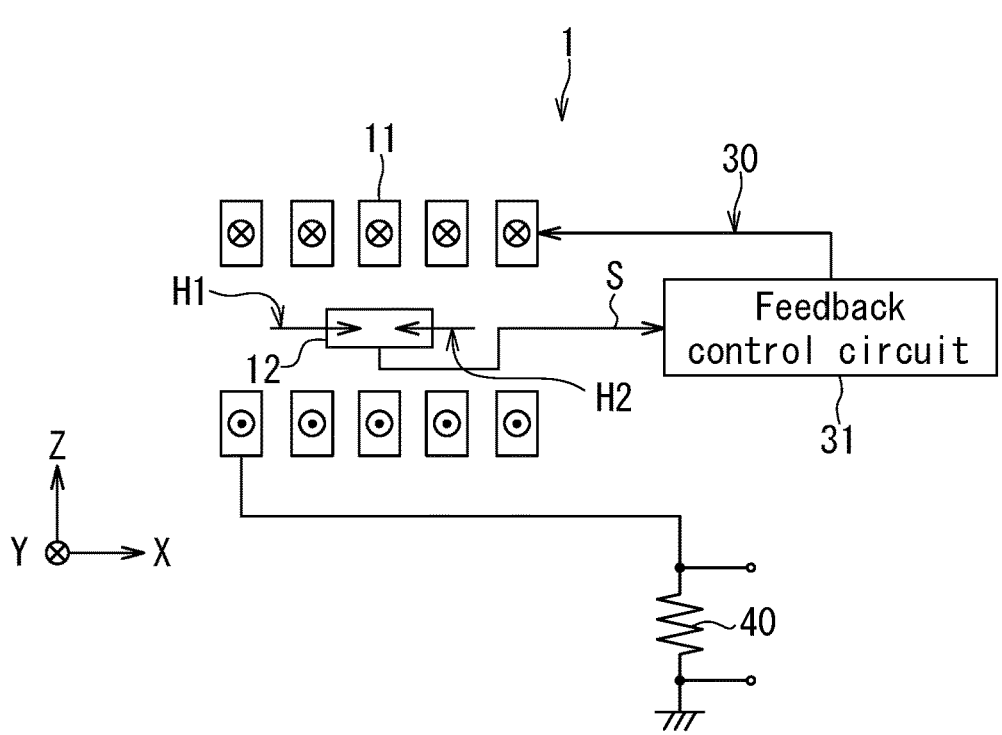
FIG. 4 is a block diagram illustrating the configuration of the current sensor according to the embodiment of the invention.

The coil 11 is to generate a second magnetic field H2 that cancels out the first magnetic field H1. The magnetic sensor 12 detects, as a magnetic field to be detected, a composite magnetic field of the first and second magnetic fields H1 and H2, and generates a magnetic-field detection value S dependent on the strength of the magnetic field to be detected. Hereinafter, the magnetic field to be detected will be referred to as the target magnetic field. The first magnetic field H1 and the second magnetic field H2 are shown in FIG. 4 to be described later.

In this embodiment, the direction of each of the first and second magnetic fields H1 and H2 and the direction of the target magnetic field are parallel to the X direction. A direction parallel to the X direction corresponds to the second direction in the present invention. The configuration of the magnetic sensor 12 will be described in detail later.

As shown in FIG. 2, the current sensor 1 further includes a substrate 61, insulating layers 62, 63 and 64, and nonmagnetic layers 65, 66 and 67. The nonmagnetic layers 65, 66 and 67 may be insulators or conductors. The insulating layer 62 lies on the substrate 61. The magnetic sensor 12 lies on the insulating layer 62. The insulating layer 63 is disposed to cover the magnetic sensor 12 and the insulating layer 62. The insulating layer 64 lies on the insulating layer 63. The coil 11 is embedded in the insulating layers 62 to 64 so as not to be in contact with the substrate 61.

The first magnetic layer 51 lies on the insulating layer 64. The nonmagnetic layer 65 lies on the insulating layer 64 and surrounds the first magnetic layer 51. The nonmagnetic layer 66 is disposed to cover the first magnetic layer 51 and the nonmagnetic layer 65. The second magnetic layer 52 lies on the nonmagnetic layer 66. The nonmagnetic layer 67 lies on the nonmagnetic layer 66 and surrounds the second magnetic layer 52.

As shown in FIG. 2, the nonmagnetic layer 66 is interposed between the first magnetic layer 51 and the second magnetic layer 52 to separate them from each other. The second magnetic layer 52 is therefore in non-contact with the first magnetic layer 51. The shapes of the first and second magnetic layers 51 and 52 will be described in detail later.

Reference is now made to FIG. 4 to describe portions of the current sensor 1 other than the main body 10. FIG. 4 is a block diagram illustrating the configuration of the current sensor 1. As shown in FIG. 4, the current sensor 1 further includes a feedback circuit 30 and a current detector 40. The feedback circuit 30 controls, in accordance with the magnetic-field detection value S, a feedback current to be used to generate the second magnetic field H2, and passes the feedback current through the coil 11. The current detector 40 generates a detection value of the feedback current passed through the coil 11. The current detector 40 is, for example, a resistor inserted to a current path of the feedback current. A potential difference across the resistor corresponds to the detection value of the feedback current. The detection value of the feedback current generated by the current detector 40 will hereinafter be referred to as a current detection value. The current detection value is in proportion to the value of the target current Itg. The current detection value thus corresponds to the detection value of the target current Itg.

The feedback circuit 30 includes a feedback control circuit 31. The feedback control circuit 31 generates the feedback current controlled in accordance with the magnetic-field detection value S, and supplies it to the coil 11.

Next, the configuration of the magnetic sensor 12 will be described in detail. The magnetic sensor 12 may include at least one magnetoresistive element. The magnetoresistive element may be a spin-valve magnetoresistive element or an anisotropic magnetoresistive (AMR) element. The spin-valve magnetoresistive element may be a tunneling magnetoresistive (TMR) element or a giant magnetoresistive (GMR) element. The spin-valve magnetoresistive element includes a magnetization pinned layer whose magnetization direction is pinned, a free layer which is a magnetic layer whose magnetization direction varies depending on the direction and strength of an applied magnetic field, a nonmagnetic layer located between the magnetization pinned layer and the free layer, and an antiferromagnetic layer. The magnetization pinned layer is located between the antiferromagnetic layer and the nonmagnetic layer. The antiferromagnetic layer is formed of an antiferromagnetic material, and establishes exchange coupling with the magnetization pinned layer to pin the magnetization direction of the magnetization pinned layer. In TMR elements, the nonmagnetic layer is a tunnel barrier layer. In GMR elements, the nonmagnetic layer is a nonmagnetic conductive layer.

An example of configuration of the magnetic sensor 12 will now be described. In this example, the magnetic sensor 12 includes a Wheatstone bridge circuit 13.

Figure 5:
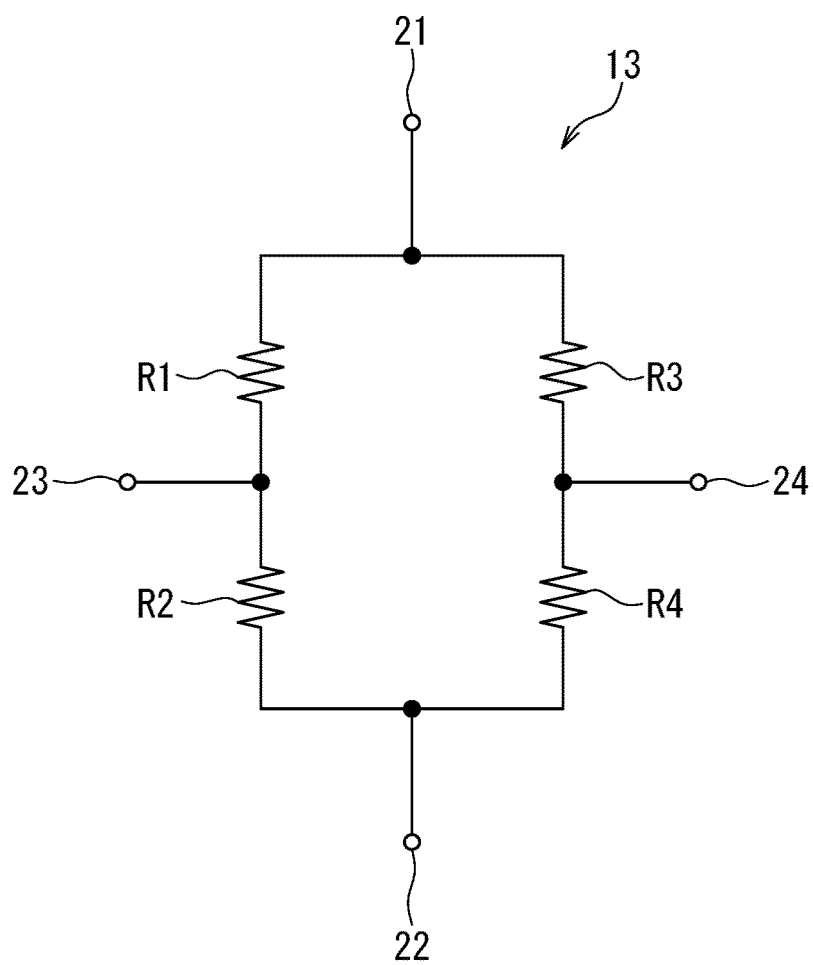
FIG. 5 is a circuit diagram illustrating a Wheatstone bridge circuit, which is part of a magnetic sensor in the current sensor according to the embodiment of the invention.

FIG. 5 is a circuit diagram illustrating the Wheatstone bridge circuit 13. The Wheatstone bridge circuit 13 has a power supply port 21, a ground port 22, a first output port 23, a second output port 24, and four resistor sections R1, R2, R3 and R4.

The resistor section R1 is provided between the power supply port 21 and the first output port 23. The resistor section R2 is provided between the first output port 23 and the ground port 22. The resistor section R3 is provided between the power supply port 21 and the second output port 24. The resistor section R4 is provided between the second output port 24 and the ground port 22. The power supply port 21 is configured to receive a power supply voltage of predetermined magnitude. The ground port 22 is connected to the ground.

Each of the resistor sections R1, R2, R3 and R4 includes a spin-valve magnetoresistive element. The magnetization pinned layer of the magnetoresistive element of each of the resistor sections R1 and R4 has a first magnetization direction. The magnetization pinned layer of the magnetoresistive element of each of the resistor sections R2 and R3 has a second magnetization direction opposite to the first magnetization direction. Here, a direction parallel to the first and second magnetization directions will be referred to as magnetosensitive direction. The free layer of each magnetoresistive element preferably has a shape magnetic anisotropy whose easy axis is orthogonal to the magnetosensitive direction.

The magnetic field 3 generated by the target current Itg and a magnetic field generated by the coil 11 are applied to the Wheatstone bridge circuit 13. The Wheatstone bridge circuit 13 is positioned such that the directions of the aforementioned two magnetic fields to be applied thereto are opposite or substantially opposite to each other, and is oriented such that the magnetosensitive direction is parallel or substantially parallel to the directions of the aforementioned two magnetic fields.

In this example, the first magnetic field H1 is a component in the magnetosensitive direction of the magnetic field generated by the target current Itg and applied to the Wheatstone bridge circuit 13. The second magnetic field H2 is a component in the magnetosensitive direction of the magnetic field generated by the coil 11 and applied to the Wheatstone bridge circuit 13.

In the Wheatstone bridge circuit 13, a potential difference between the output ports 23 and 24 varies depending on the strength of the target magnetic field. The magnetic sensor 12 outputs a magnetic-field detection value S corresponding to the potential difference between the output ports 23 and 24 of the Wheatstone bridge circuit 13. The strength of the target magnetic field, the potential difference between the output ports 23 and 24, and the magnetic-field detection value S can be of positive or negative values depending on the magnitudes of the first magnetic field H1 and the second magnetic field H2 relative to each other.

The shapes of the first magnetic layer 51 and the second magnetic layer 52 will now be described in detail with reference to FIG. 2. Each of the first magnetic layer 51 and the second magnetic layer 52 has a first dimension in the first direction, i.e., a dimension in the Z direction, and a second dimension in the second direction, i.e., a dimension in the X direction. As shown in FIG. 2, in each of the first and second magnetic layers 51 and 52, the dimension in the X direction is greater than the dimension in the Z direction. The first magnetic layer 51 preferably smaller in the dimension in the X direction than the second magnetic layer 52.

Figure 7A:
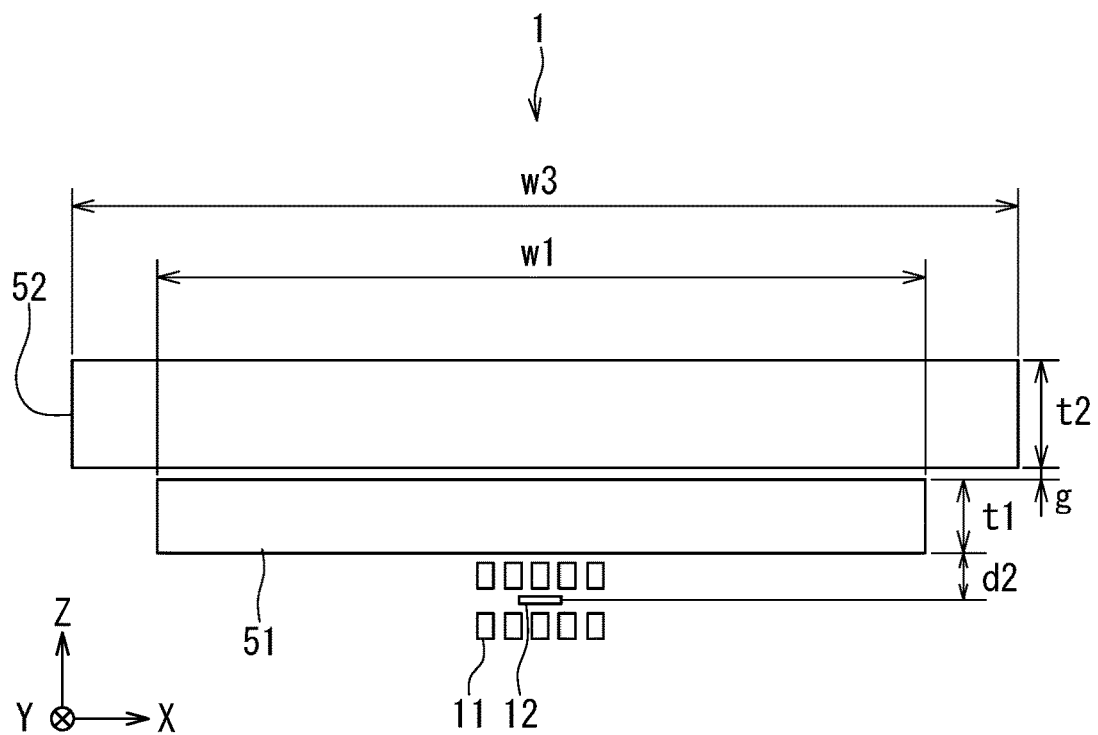
FIG. 7A is an explanatory diagram for explaining a plurality of structural parameters that have effects on the characteristics of the current sensor according to the embodiment of the invention.
Figure 7B:
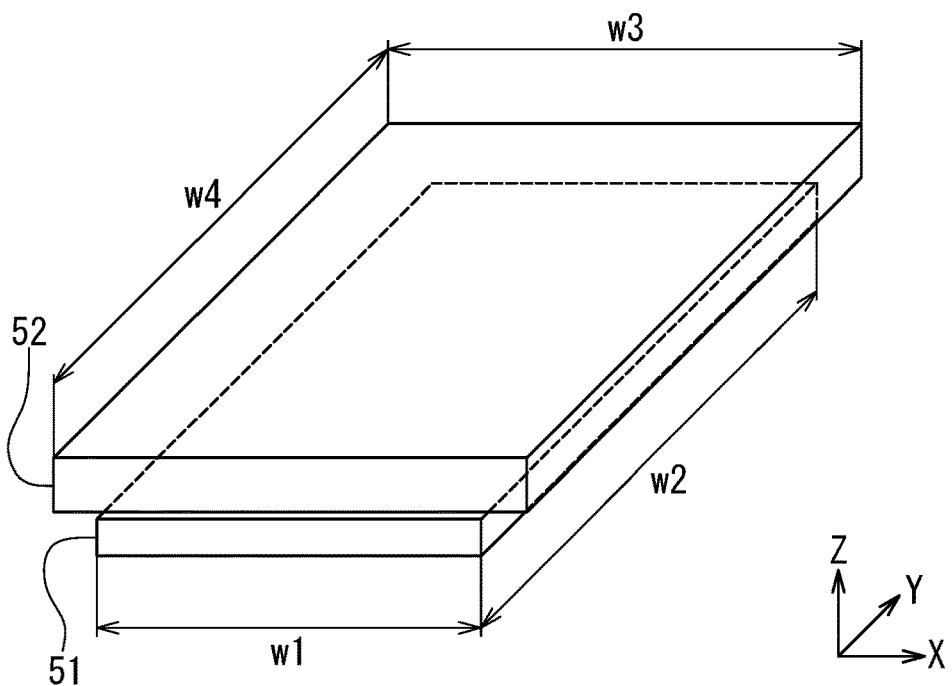
FIG. 7B is an explanatory diagram for explaining a plurality of structural parameters that have effects on the characteristics of the current sensor according to the embodiment of the invention.

A direction orthogonal to the first and second directions will be referred to as the third direction. In this embodiment, the third direction is parallel to the Y direction. Each of the first and second magnetic layers 51 and 52 further has a third dimension in the third direction, i.e., a dimension in the Y direction. The dimension in the Y direction of each of the first and second magnetic layers 51 and 52 is shown in FIG. 7B to be described later. In each of the first and second magnetic layers 51 and 52, the dimension in the Y direction is greater than the dimension in the X direction. The dimension in the Y direction of the first magnetic layer 51 is preferably smaller than or equal to the dimension in the Y direction of the second magnetic layer 52.

The first magnetic layer 51 is preferably smaller in volume than the second magnetic layer 52. To achieve this, the first magnetic layer 51 is preferably smaller in at least one of the dimension in the Z direction and the dimension in the X direction than the second magnetic layer 52. FIG. 2 illustrates an example in which the first magnetic layer 51 is smaller in both of the dimension in the Z direction and the dimension in the X direction than the second magnetic layer 52.

When one of the dimension in the Z direction and the dimension in the X direction of the first magnetic layer 51 is greater than that of the second magnetic layer 52, the first magnetic layer 51 can be smaller in volume than the second magnetic layer 52 if the other of the dimension in the Z direction and the dimension in the X direction of the first magnetic layer 51 is smaller than that of the second magnetic layer 52. The first magnetic layer 51 may thus have such a shape.

For example, each of the first and second magnetic layers 51 and 52 has a rectangular shape when viewed from above. The first and second magnetic layers 51 and 52 are preferably sized and located to overlay the entirety of the magnetic sensor 12 when viewed from above. The magnetic sensor 12 has a dimension in the X direction of, for example, 0.3 to 50 μm, and each of the first and second magnetic layers 51 and 52 has a dimension in the X direction of, for example, several micrometers to several hundreds of micrometers. Although not illustrated, the magnetic sensor 12 has a dimension in the Y direction of, for example, 1 to 200 μm, and each of the first and second magnetic layers 51 and 52 has a dimension in the Y direction of, for example, several micrometers to several hundreds of micrometers. Each of the first and second magnetic layers 51 and 52 has a dimension in the Z direction of, for example, 0.5 μm to several tens of micrometers.

The first magnetic layer 51 may be lower in coercivity than the second magnetic layer 52. The reason therefor will be described later.

Now, the effects of the current sensor 1 and the magnetic sensor device 50 according to the embodiment will be described with reference to the results of a plurality of simulations. First, a description will be given of current sensors of first and second comparative examples and current sensors 1 of first and second examples used in the simulations.

The current sensor of the first comparative example has the same configuration as that of the current sensor 1 according to the embodiment except that it has neither of first and second magnetic layers 51 and 52.

Figure 6:
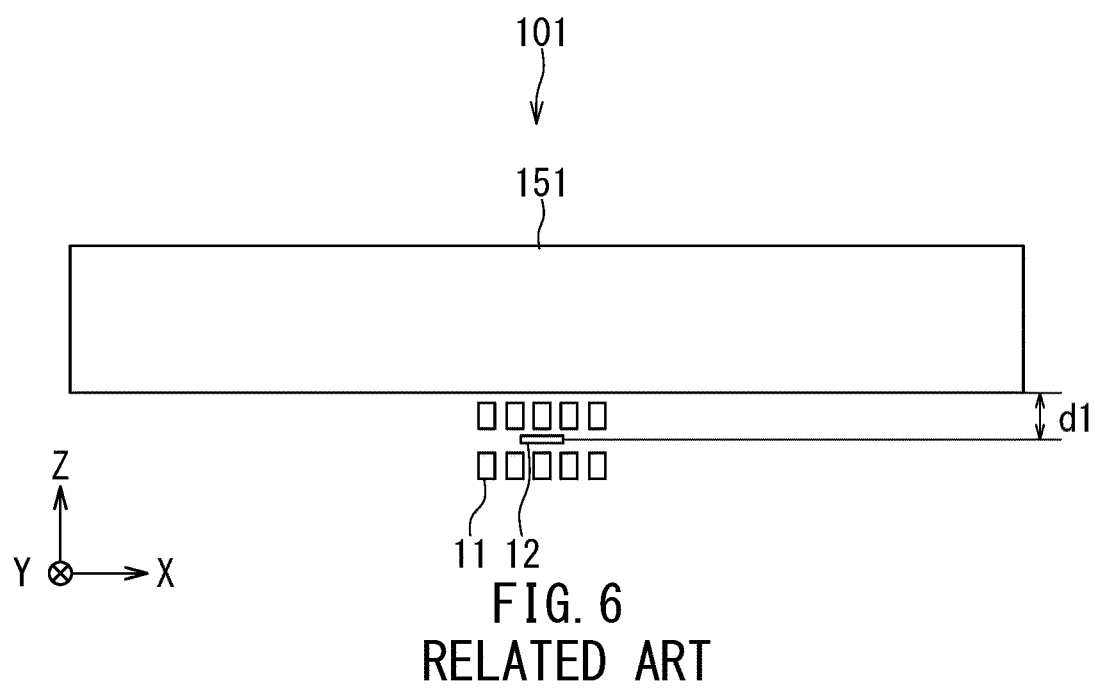
FIG. 6 is an explanatory diagram illustrating a portion of a current sensor of a second comparative example.

FIG. 6 is an explanatory diagram illustrating a portion of the current sensor 101 of the second comparative example. The current sensor 101 of the second comparative example is provided with a single magnetic layer 151 instead of the first and second magnetic layers 51 and 52. The magnetic layer 151 is located above the magnetic sensor 12. The remainder of configuration of the current sensor 101 of the second comparative example is the same as that of the current sensor 1 according to the embodiment.

The magnetic layer 151 has a dimension in the Z direction of 7 μm. The magnetic layer 151 has a dimension in the X direction of 40 μm. The magnetic layer 151 has a dimension in the Y direction of 100 μm. As shown in FIG. 6, the symbol d1 represents the distance from the center in the Z direction of the magnetic sensor 12 to the magnetic layer 151. The value of d1 will be described later.

The current sensors 1 of the first and second examples each correspond to the current sensor 1 according to the embodiment. FIGS. 7A and 7B are explanatory diagrams for explaining a plurality of structural parameters that have effects on the characteristics of the current sensor 1 according to the embodiment. As shown in FIG. 7A and FIG. 7B, the symbol w1 represents the dimension in the X direction of the first magnetic layer 51, and the symbol w3 represents the dimension in the X direction of the second magnetic layer 52. In the first example, the dimension w1 in the X direction of the first magnetic layer 51 is equal to the dimension w3 in the X direction of the second magnetic layer 52. In the second example, the dimension w1 in the X direction of the first magnetic layer 51 is smaller than the dimension w3 in the X direction of the second magnetic layer 52.

In each of the first and second examples, the dimension w3 in the X direction of the second magnetic layer 52 is 40 μm. In the first example, the dimension w1 in the X direction of the first magnetic layer 51 is also 40 μm. Further, as shown in FIG. 7A and FIG. 7B, the symbol t1 represents the dimension in the Z direction of the first magnetic layer 51, the symbol t2 represents the dimension in the Z direction of the second magnetic layer 52, the symbol w2 represents the dimension in the Y direction of the first magnetic layer 51, the symbol w4 represents the dimension in the Y direction of the second magnetic layer 52, the symbol d2 represents the distance from the center in the Z direction of the magnetic sensor 12 to the first magnetic layer 51, and the symbol g represents the gap between the first magnetic layer 51 and the second magnetic layer 52. In each of the first and second examples, the dimensions w2 and w4 are both 100 μm. The values of t1, t2, d2 and g, and also the value of w1 of the second example will be described later.

The results of a first simulation will now be described. The first simulation investigated the effects of the magnetic layers on the characteristics of the current sensor. In the first simulation, an external magnetic field H in a direction parallel to the X direction was applied to each of the current sensor of the first comparative example and the current sensor 101 of the second comparative example to investigate the relationship between a magnetic flux density B corresponding to the external magnetic field H, calculated from the external magnetic field H, and the magnetic-field detection value S. The magnitude of the external magnetic field H was increased and decreased within a predetermined range including positive values and negative values. In the first simulation, the distance d1 was set at 2.5 μm.

Figure 8:
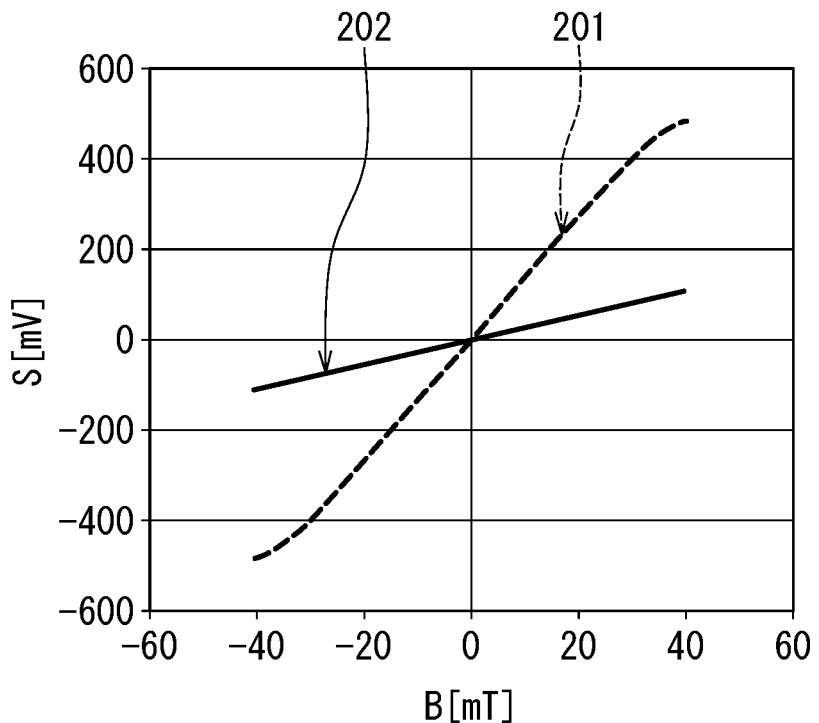
FIG. 8 is a characteristic chart illustrating the results of a first simulation.

FIG. 8 illustrates the characteristics of the current sensor of the first comparative example and the current sensor 101 of the second comparative example obtained from the first simulation. In FIG. 8, the horizontal axis represents the magnetic flux density B, and the vertical axis represents the magnetic-field detection value S. In FIG. 8, the dashed curve 201 represents the characteristic of the current sensor of the first comparative example, and the solid curve 202 represents the characteristic of the current sensor 101 of the second comparative example.

As shown in FIG. 8, the second comparative example (see the reference numeral 202) shows a smaller gradient of change in the magnetic-field detection value S versus the change in the magnetic flux density B, compared with the first comparative example (see the reference numeral 201). This is because of the function of the magnetic layer 151. To be more specific, the magnetic layer 151 has the function of capturing part of magnetic flux generated by the external magnetic field H and thereby making the absolute value of the first magnetic field H1 smaller than in the case without the magnetic layer 151. The magnetic-field detection value S varies depending on the value of the first magnetic field H1. For these reasons, the gradient of change in the magnetic-field detection value S versus the change in the magnetic flux density B is smaller in the second comparative example than in the first comparative example.

For the first comparative example, when the absolute value of the target magnetic field reaches a predetermined magnitude or greater, the linearity of the output characteristic of the current sensor, i.e., the linearity of the magnetic-field detection value S to the target magnetic field, deteriorates. On the other hand, for the second comparative example, the absolute value range of the first magnetic field H1 is narrowed by virtue of the above-described function of the magnetic layer 151, and as a result, the absolute value range of the target magnetic field is also narrowed. The narrower the absolute value range of the target magnetic field, the greater is the maximum absolute value of a target current Itg that can be detected using a range of the magnetic-field detection value S having a good linearity to the target magnetic field.

Figure 9:
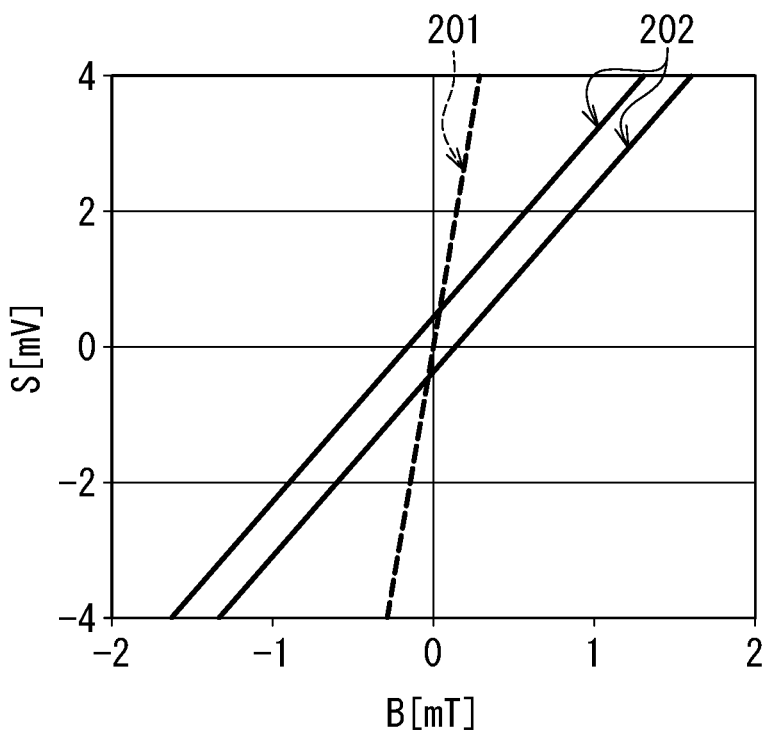
FIG. 9 is a characteristic chart showing part of FIG. 8 on an enlarged scale.

FIG. 9 shows part of the characteristics shown in FIG. 8 on an enlarged scale. As shown in FIG. 9, in the second comparative example (see the reference numeral 202) the magnetic-field detection value S shows an offset. An offset of the magnetic-field detection value S refers to a deviation of the magnetic-field detection value S from a predetermined reference value, e.g., 0 mV, when the value of the magnetic flux density B is 0. The offset of the magnetic-field detection value S causes an error in the current detection value.

The magnetic layer 151 has a hysteresis property. Thus, when the magnitude of the external magnetic field H is increased and decreased within a predetermined range as in the first simulation, a certain amount of magnetization remains in the magnetic layer 151 in the direction of the applied magnetic field even after the external magnetic field H has disappeared. Accordingly, in the second comparative example, when the value of the magnetic flux density B is 0, the magnetization remaining in the magnetic layer 151 applies a magnetic field to the magnetic sensor 12. The magnetization remaining in the magnetic layer 151 in the absence of the external magnetic field H will hereinafter be referred to as residual magnetization. Due to the residual magnetization, an offset occurs in the magnetic-field detection value S.

The absolute value of the difference between two magnetic flux densities B when the magnetic-field detection value S is 0 will be referred to as a hysteresis parameter. An error that occurs in the current detection value due to the hysteresis property increases as the value of the hysteresis parameter increases.

Next, the results of a second simulation will be described. The second simulation investigated the effects of the magnetic layer 151 and the first and second magnetic layers 51 and 52 on the characteristics of the current sensor 1. In the second simulation, an external magnetic field H in a direction parallel to the X direction was applied to each of the current sensor 101 of the second comparative example and the current sensors 1 of the first and second examples to investigate the relationship between the magnetic flux density B and the magnetic-field detection value S. The magnitude of the external magnetic field H was increased and decreased within a predetermined range including positive values and negative values. In the second simulation, the structural parameters shown in FIGS. 7A and 7B were set as follows. The dimension t1 was set at 2 µm. The dimension t2 was set at 5 µm. The distances d1 and d2 were set at 2.5 µm. The gap g was set at 0.2 µm. The dimension w1 of the second example was set at 30 µm.

Figure 10:
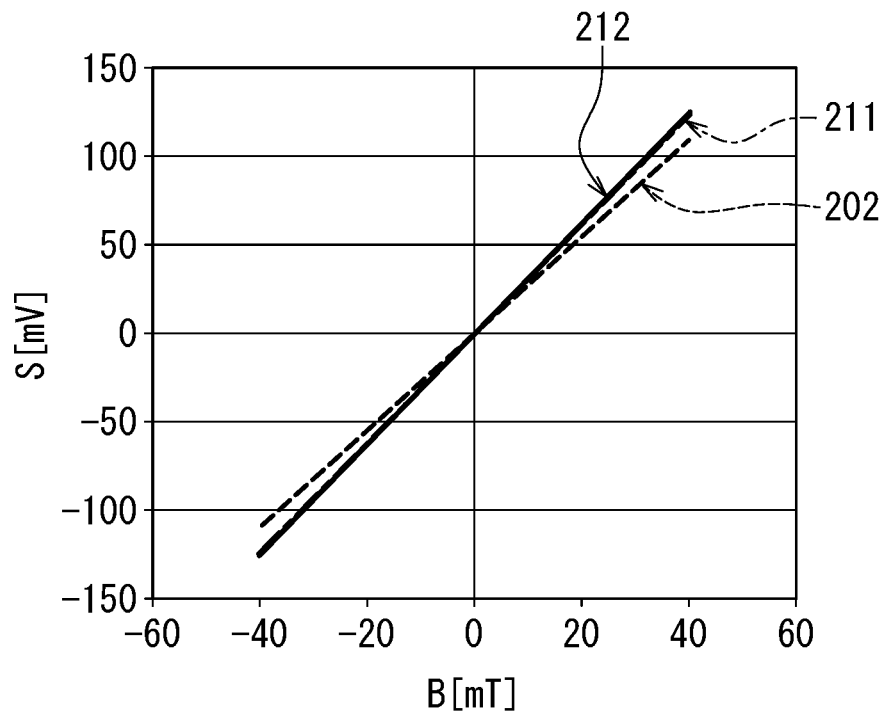
FIG. 10 is a characteristic chart illustrating the results of a second simulation.

FIG. 10 illustrates the characteristics of the current sensor 101 of the second comparative example and the current sensors 1 of the first and second examples obtained from the second simulation. In FIG. 10, the horizontal axis represents the magnetic flux density B, and the vertical axis represents the magnetic-field detection value S. In FIG. 10, the dashed curve 202 represents the characteristic of the current sensor 101 of the second comparative example, the dot-and-dash curve 211 represents the characteristic of the current sensor 1 of the first example, and the solid curve 212 represents the characteristic of the current sensor 1 of the second example. In FIG. 10 the curves 211 and 212 substantially coincide with each other.

As shown in FIG. 10, the gradient of change in the magnetic-field detection value S versus the change in the magnetic flux density B for each of the first and second examples (see the reference numerals 211 and 212) is almost the same as that for the second comparative example (see the reference numeral 202). This is because of the function of the first and second magnetic layers 51 and 52 similar to the magnetic layer 151. To be more specific, the first and second magnetic layers 51 and 52 have the function of making the absolute value of the first magnetic field H1 smaller than in the case without the first and second magnetic layers 51 and 52. For this reason, each of the first and second examples shows a smaller gradient of change in the magnetic-field detection value S versus the change in the magnetic flux density B, compared with the first comparative example shown in FIG. 8 (see the reference numeral 201).

Figure 11:
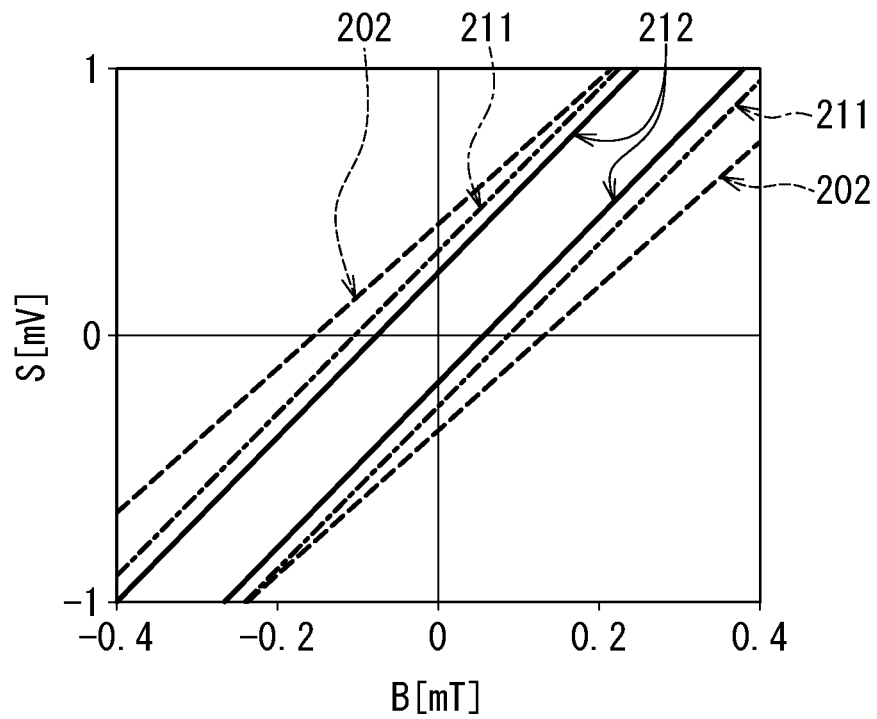
FIG. 11 is a characteristic chart showing part of FIG. 10 on an enlarged scale.

FIG. 11 shows part of the characteristics shown in FIG. 10 on an enlarged scale. As shown in FIG. 11, the first and second examples (see the reference numerals 211 and 212) show smaller values of hysteresis parameter compared with the second comparative example (see the reference numeral 202). Further, the second example (see the reference numeral 212) shows smaller values of hysteresis parameter compared with the first example (see the reference numeral 211). The reason for the smaller values of hysteresis parameter will be described later.

As a plurality of performance parameters for current sensors, detection sensitivity, offset parameter, hysteresis parameter (described above), and shield factor will now be considered. The detection sensitivity is the ratio of a variation in the magnetic-field detection value S to a variation in the magnetic flux density B in a range of the magnetic-field detection value S having a good linearity to the target magnetic field. The offset parameter is the absolute value of the difference between two magnetic-field detection values S when the magnetic flux density B is 0. The shield factor is the ratio of the detection sensitivity of each of the second comparative example and the first and second examples to the detection sensitivity in the case where none of the magnetic layers 51, 52, and 151 is present, in other words, the detection sensitivity of the first comparative example, expressed as a percentage. Table 1 below shows the values of the performance parameters of the first and second examples and the first and second comparative examples obtained from the first and second simulations, with the shield factor of the first comparative example as 100%.

TABLE 1

|  | First comparative example | Second comparative example | First example | Second example |
| --- | --- | --- | --- | --- |
| Detection sensitivity (mV/mT) | 13.7 | 2.7 | 3.1 | 3.1 |
| Offset parameter (mV) | 0.01 | 0.77 | 0.58 | 0.41 |
| Hysteresis parameter (mT) | 0.00 | 0.28 | 0.19 | 0.13 |
| Shield factor (%) | 100.0 | 19.9 | 22.5 | 22.8 |

As shown in Table 1, each of the first and second examples shows a smaller value of detection sensitivity compared with the first comparative example. The smaller the value of detection sensitivity, the wider is the range of detectable values of the target current Itg. Therefore, according to this embodiment, the provision of the first magnetic layer 51 and the second magnetic layer 52 enables extension of the range of detectable values of the target current Itg relative to the case where no magnetic layer is provided, like the first comparative example.

Further, as shown in Table 1, each of the first and second examples shows a smaller value of hysteresis parameter compared with the second comparative example. The smaller the value of hysteresis parameter, the lower is the error occurring in the current detection value due to the hysteresis property of a magnetic layer. Therefore, according to this embodiment, the provision of the first magnetic layer 51 and the second magnetic layer 52 allows the current detection value to contain a lower error than in the case where only a single magnetic layer 151 is provided, like the second comparative example.

The value of hysteresis parameter of the second example is lower than that of the first example. This indicates that making the dimension w1 in the X direction of the first magnetic layer 51 smaller than the dimension w3 in the X direction of the second magnetic layer 52, as in the second example, contributes to a reduction in the value of hysteresis parameter, thus leading to a still lower error in the current detection value.

Further, as shown in Table 1, each of the first and second examples shows a smaller value of offset parameter compared with the second comparative example. As with the hysteresis parameter, the smaller the value of offset parameter, the lower is the error occurring in the current detection value due to the hysteresis property of a magnetic layer.

A smaller shield factor contributes to a reduction in the absolute value of the first magnetic field H1 relative to the first comparative example. As shown in Table 1, the first example and the second example have almost the same values of shield factor.

Figure 12:
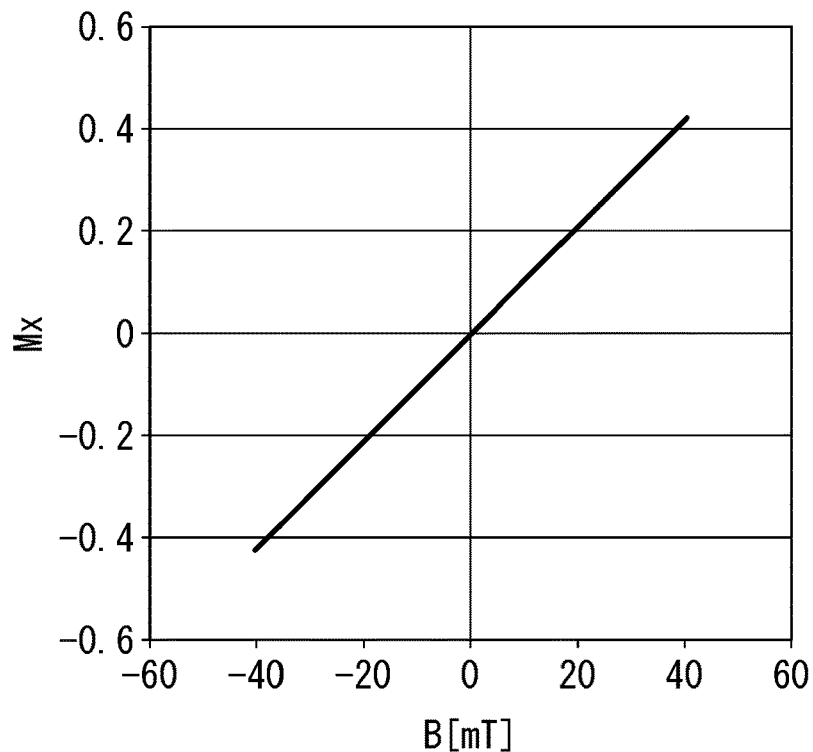
FIG. 12 is a characteristic chart illustrating the characteristic of a magnetic layer of the second comparative example obtained from a third simulation.
Figure 13:
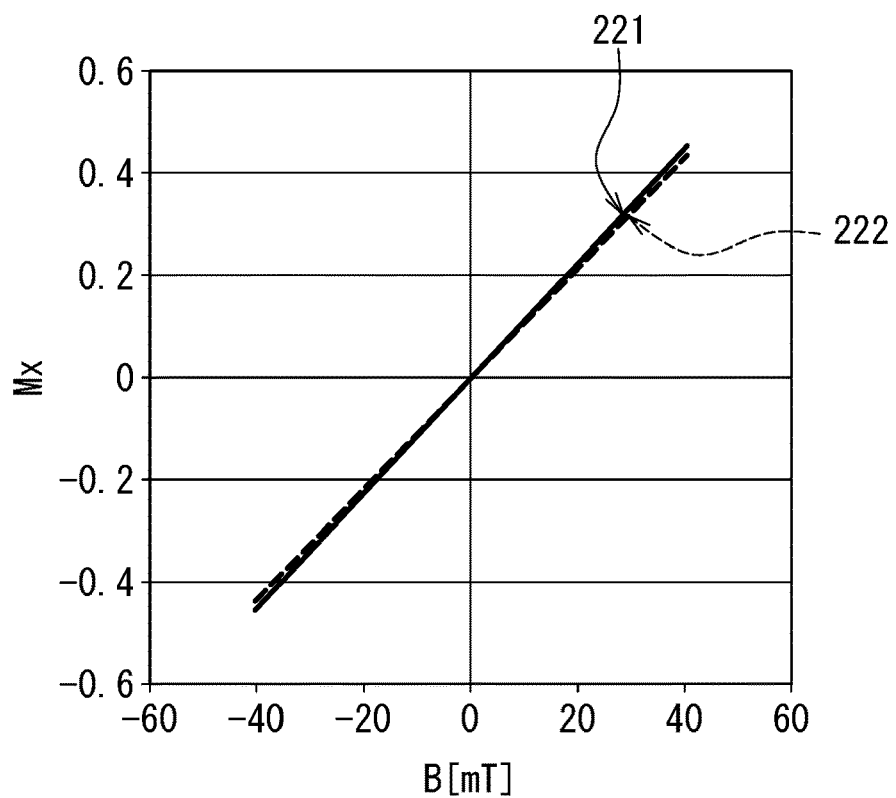
FIG. 13 is a characteristic chart illustrating the characteristics of first and second magnetic layers of a first example obtained from the third simulation.
Figure 14:
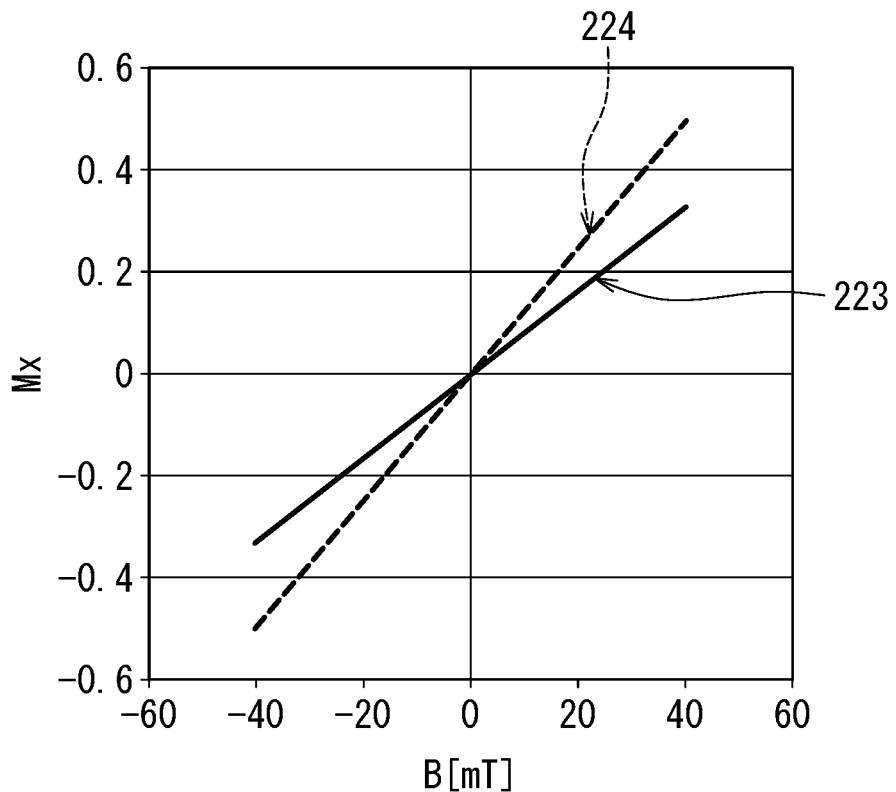
FIG. 14 is a characteristic chart illustrating the characteristics of first and second magnetic layers of a second example obtained from the third simulation.

The results of a third simulation will now be described. The third simulation investigated the magnetizations Mx of the magnetic layers 51, 52, and 151 by application of an external magnetic field H in a direction parallel to the X direction to each of the current sensor 101 of the second comparative example and the current sensors 1 of the first and second examples. The magnitude of the external magnetic field H was increased and decreased within a predetermined range including positive values and negative values. The value of each magnetization Mx is an average of the values of components of the magnetization that are in directions parallel to the X direction. In FIGS. 12 to 14 described below, the value of the magnetization Mx of each magnetic layer is a normalized value obtained by dividing the value of the magnetization Mx of the magnetic layer expressed in a predetermined unit by the value of the saturated magnetization of the magnetic layer itself expressed in the predetermined unit. The shapes and arrangements of the magnetic layers 51, 52, and 151 in the third simulation are the same as those in the second simulation.

FIG. 12 shows the characteristic of the magnetic layer 151 of the second comparative example obtained from the third simulation. FIG. 13 shows the characteristics of the first and second magnetic layers 51 and 52 of the first example obtained from the third simulation. FIG. 14 shows the characteristics of the first and second magnetic layers 51 and 52 of the second example obtained from the third simulation. In each of FIGS. 12 to 14, the horizontal axis represents the magnetic flux density B, and the vertical axis represents the magnetization Mx. In FIG. 13, the solid curve 221 represents the characteristic of the first magnetic layer 51, and the dashed curve 222 represents the characteristic of the second magnetic layer 52. In FIG. 14, the solid curve 223 represents the characteristic of the first magnetic layer 51, and the dashed curve 224 represents the characteristic of the second magnetic layer 52.

The gradient of change in the magnetization Mx versus the change in the magnetic flux density B will hereinafter be referred to as magnetization change ratio. As shown in FIGS. 12 to 14, the magnetization change ratio of the magnetic layer 151 of the second comparative example, that of the first magnetic layer 51 of the first example (see the reference numeral 221), that of the second magnetic layer 52 of the first example (see the reference numeral 222), and that of the second magnetic layer 52 of the second example (see the reference numeral 224) are almost the same. The magnetization change ratio of the first magnetic layer 51 of the second example (see the reference numeral 223) is lower than that of each of the other magnetic layers except the first magnetic layer 51 of the second example. This is because the dimension w1 in the X direction of the first magnetic layer 51 of the second example is smaller than the dimension in the X direction of each of the other magnetic layers except the first magnetic layer 51 of the second example.

Now, discussions will be made as to the reason why the second example in the second simulation showed a smaller value of hysteresis parameter compared with the first example.

For the first magnetic layer 51, the smaller the dimension w1 in the X direction, i.e., the magnetosensitive direction, the lower the magnetization change ratio and also the residual magnetization in the X direction to remain in the first magnetic layer 51 in the absence of the external magnetic field H, and as a result, the smaller the value of hysteresis parameter.

Furthermore, for the first magnetic layer 51, the smaller the volume, the lower the residual magnetization in the X direction, and as a result, the smaller the value of hysteresis parameter.

The first magnetic layer 51 of the second example is smaller in both of the dimension w1 in the X direction and volume than the first magnetic layer 51 of the first example. This results in a smaller value of hysteresis parameter in the second example than in the first example.

Parameters that have effects on the residual magnetization, other than dimensions, include coercivity. Given that the coercivity of the second magnetic layer 52 is of a fixed value, making the coercivity of the first magnetic layer 51 lower than that of the second magnetic layer 52 results in a reduction in the residual magnetization in the X direction, and consequently a reduction in the value of hysteresis parameter, relative to the case where the coercivities of the first and second magnetic layers 51 and 52 are equal.

Next, the results of a fourth simulation will be described. The fourth simulation investigated the effect of the location of the magnetic layer nearest the magnetic sensor 12 on the characteristics of the current sensor 1. The fourth simulation investigated the relationship between the distances d1 and d2 and each of the shield factor and the hysteresis parameter in each of the current sensor 101 of the second comparative example and the current sensor 1 of the second example. In the fourth simulation, the structural parameters shown in FIGS. 6, 7A, and 7B were set as follows. The dimension t1 was set at 3 µm. The dimension t2 was set at 4 µm. The dimension w1 was set at 30 µm. The gap g was wet at 0.5 µm. The distances d1 and d2 were varied within the range of 2 to 5 µm.

In the fourth simulation, in the same manner as the first and second simulations, an external magnetic field H in a direction parallel to the X direction was applied to each of the current sensors 1 and 101 while the magnitude of the external magnetic field H was increased and decreased within a predetermined range including positive values and negative values to thereby obtain the relationship between the magnetic flux density B and the magnetic-field detection value S. Based on the obtained relationship, the detection sensitivity and the hysteresis parameter were calculated. Using the calculated detection sensitivity and also the detection sensitivity of the first comparative example (see Table 1), the shield factor was calculated. In fifth to seventh simulations described later, the shield factor and the hysteresis parameter were also calculated in the same manner as in the fourth simulation.

Figure 15:
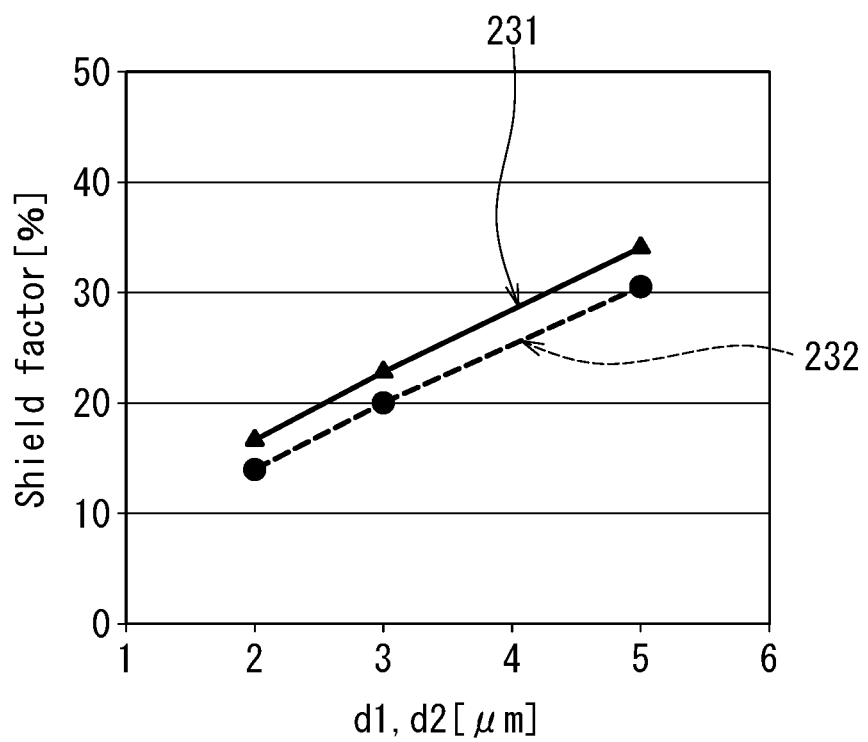
FIG. 15 is a characteristic chart illustrating the characteristic of a shield factor obtained from a fourth simulation.
Figure 16:
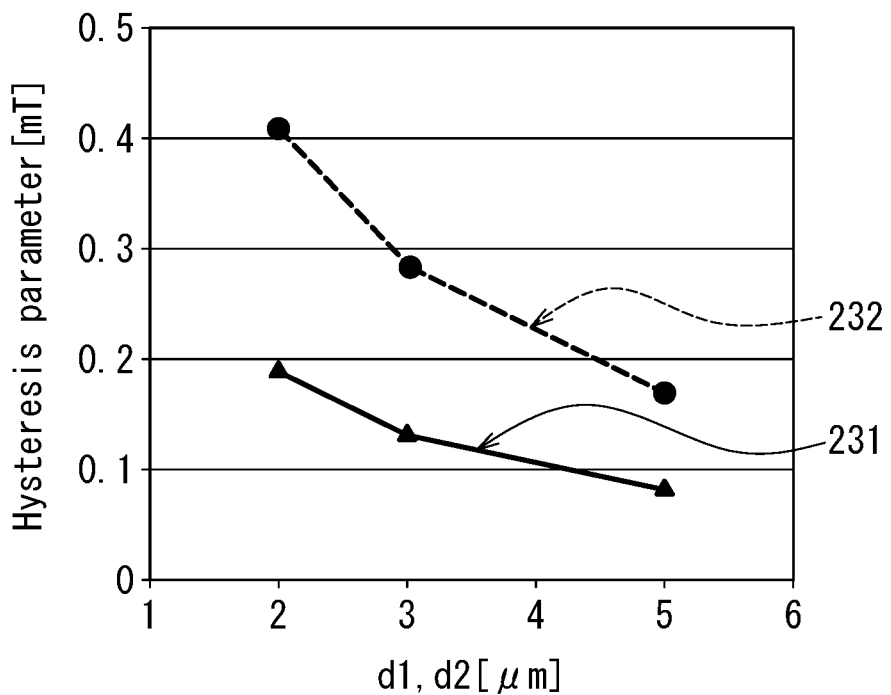
FIG. 16 is a characteristic chart illustrating the characteristic of a hysteresis parameter obtained from the fourth simulation.
Figure 17:
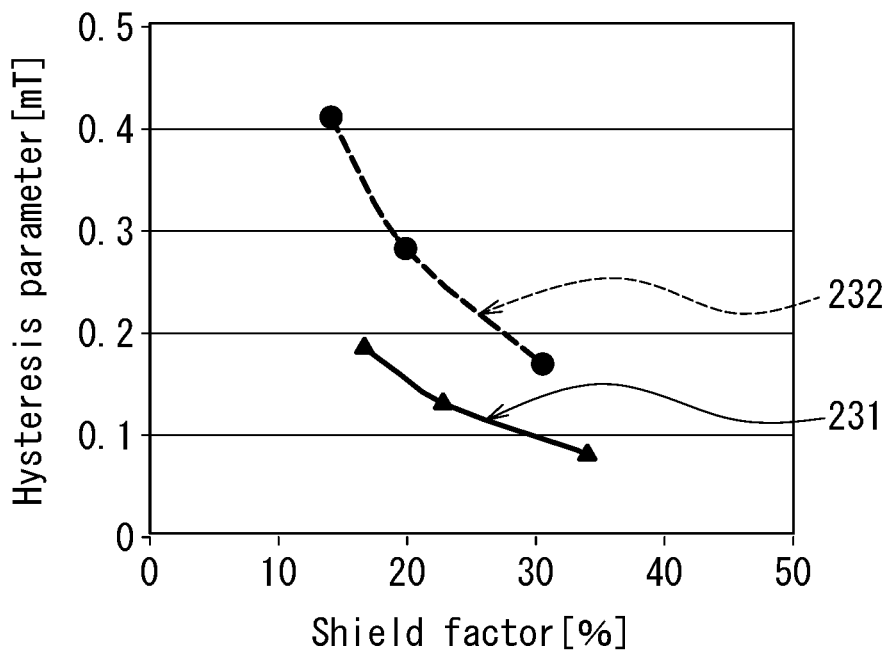
FIG. 17 is a characteristic chart illustrating the relationship between the shield factor and the hysteresis parameter obtained from the fourth simulation.

FIG. 15 is a characteristic chart illustrating the shield factor obtained from the fourth simulation. FIG. 16 is a characteristic chart illustrating the hysteresis parameter obtained from the fourth simulation. FIG. 17 is a characteristic chart illustrating the relationship between the shield factor and the hysteresis parameter obtained from the fourth simulation. In FIG. 15, the horizontal axis represents the distances d1 and d2, and the vertical axis represents the shield factor. In FIG. 16, the horizontal axis represents the distances d1 and d2, and the vertical axis represents the hysteresis parameter. In FIG. 17, the horizontal axis represents the shield factor, and the vertical axis represents the hysteresis parameter. In each of FIGS. 15 to 17, the points connected by the solid line 231 represent the characteristic of the second example, and the points connected by the dashed line 232 represent the characteristic of the second comparative example.

As is apparent from FIGS. 15 and 16, as the distances d1 and d2 increase, the value of the hysteresis parameter decreases, whereas the shield factor increases. As shown in FIG. 17, given the same shield factor, the value of the hysteresis parameter is smaller in the second example (see the reference numeral 231) than in the second comparative example (see the reference numeral 232). This embodiment thus enables a reduction in the error in the current detection value by reducing the value of the hysteresis parameter while preventing an increase in the absolute value of the first magnetic field H1.

Next, the results of a fifth simulation will be described. The fifth simulation investigated the effect of the dimension w1 in the X direction of the first magnetic layer 51 on the characteristics of the current sensor 1. The fifth simulation investigated the relationship between the dimension w1 and each of the shield factor and the hysteresis parameter in the current sensor 1 of the second example. In the fifth simulation, the structural parameters shown in FIGS. 7A and 7B were set as follows. The dimension t1 was set at 3 µm. The dimension t2 was set at 4 µm. The distance d2 was set at 2.5 µm. The gap g was set at 0.2 µm. The dimension w1 was varied within the range of 10 to 45 µm.

Figure 18:
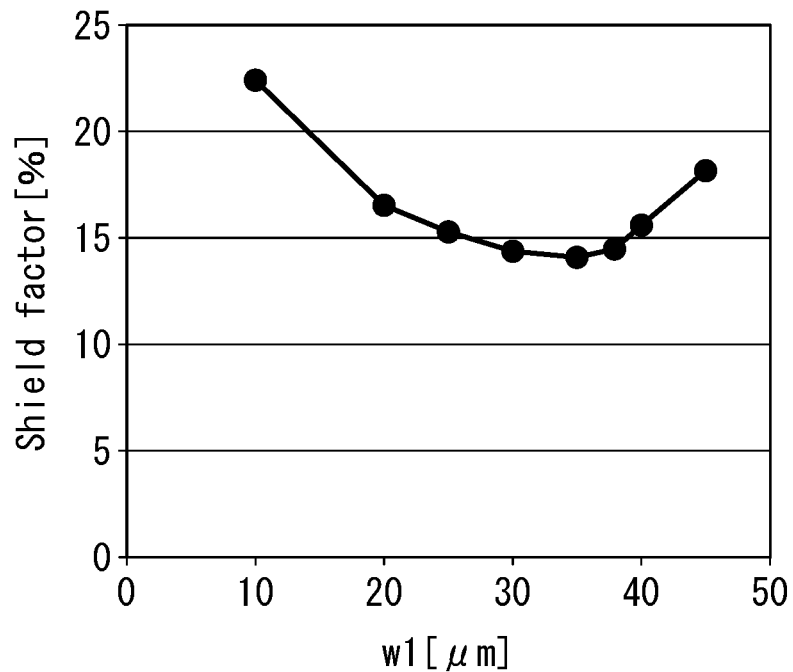
FIG. 18 is a characteristic chart illustrating the characteristic of the shield factor obtained from a fifth simulation.
Figure 19:
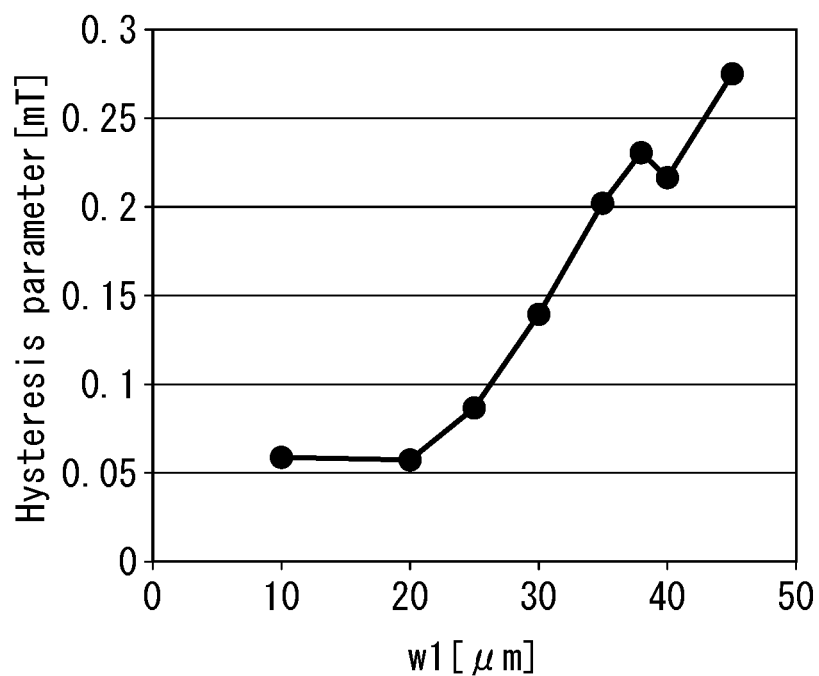
FIG. 19 is a characteristic chart illustrating the characteristic of the hysteresis parameter obtained from the fifth simulation.

FIG. 18 is a characteristic chart illustrating the shield factor obtained from the fifth simulation. FIG. 19 is a characteristic chart illustrating the hysteresis parameter obtained from the fifth simulation. In FIG. 18, the horizontal axis represents the dimension w1, and the vertical axis represents the shield factor. In FIG. 19, the horizontal axis represents the dimension w1, and the vertical axis represents the hysteresis parameter.

The value of the shield factor is preferably 22% or less. This is satisfied when the dimension w1 falls within the range shown in FIG. 18. The value of the hysteresis parameter is preferably 0.22 mT or less, which is the value of the hysteresis parameter when the dimension w1 is equal to the dimension w3 in the X direction of the second magnetic layer 52. This is satisfied when the dimension w1 is 36 µm or less, as shown in FIG. 19. In view of these findings, the dimension w1 is preferably within the range of 10 to 36 µm. The dimension w3 is 40 µm. Therefore, the ratio of the dimension w1 to the dimension w3 is preferably within the range of 25% to 90%.

Next, the results of a sixth simulation will be described. The sixth simulation investigated the effect of the dimension t1 in the Z direction of the first magnetic layer 51 on the characteristics of the current sensor 1. The sixth simulation investigated the relationship between the dimension t1 and each of the shield factor and the hysteresis parameter in the current sensor 1 of the second example. In the sixth simulation, the structural parameters shown in FIGS. 7A and 7B were set as follows. The dimension t2 was set at 4 µm. The dimension w1 was set at 30 µm. The distance d2 was set at 2.5 µm. The gap g was set at 0.2 µm. The dimension t1 was varied within the range of 0.5 to 6 µm.

Figure 20:
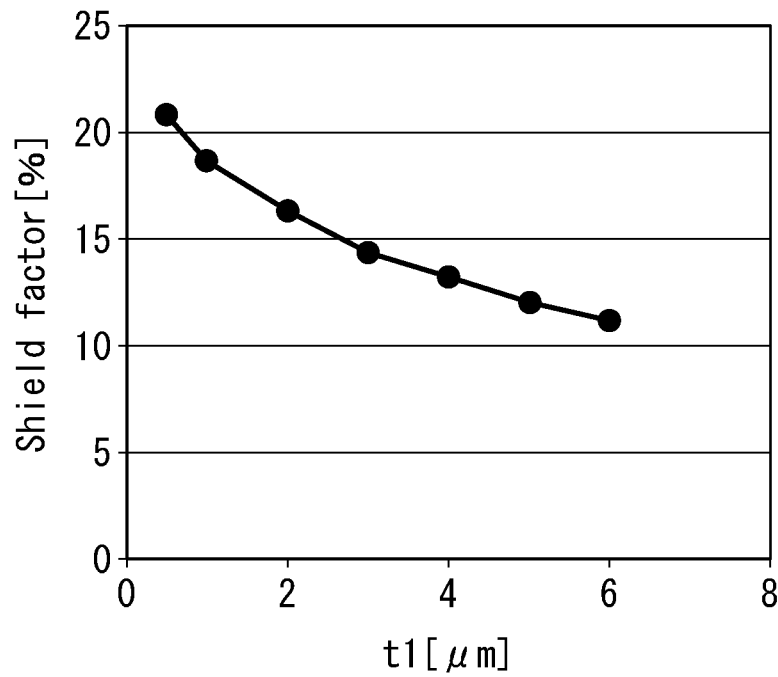
FIG. 20 is a characteristic chart illustrating the characteristic of the shield factor obtained from a sixth simulation.
Figure 21:
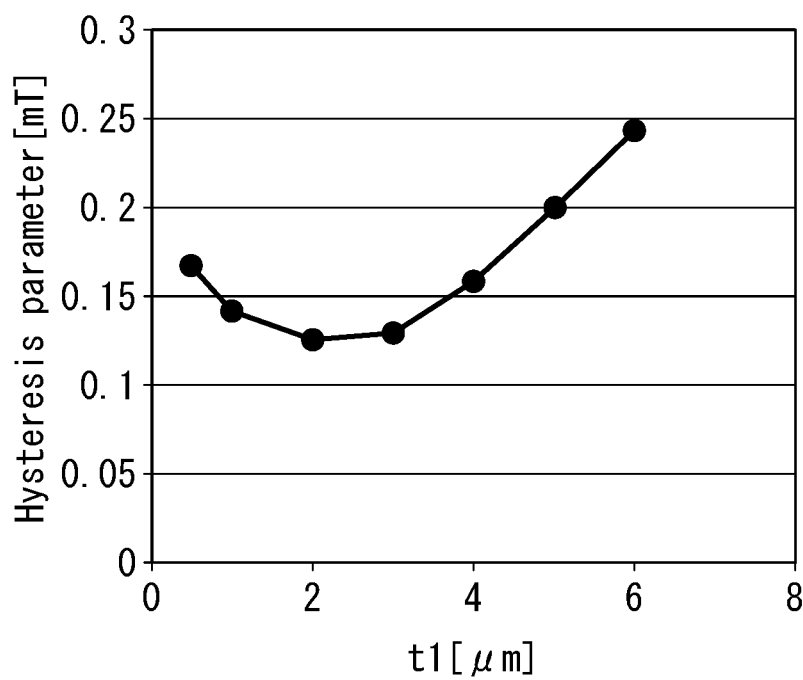
FIG. 21 is a characteristic chart illustrating the characteristic of the hysteresis parameter obtained from the sixth simulation.

FIG. 20 is a characteristic chart illustrating the shield factor obtained from the sixth simulation. FIG. 21 is a characteristic chart illustrating the hysteresis parameter obtained from the sixth simulation. In FIG. 20, the horizontal axis represents the dimension t1, and the vertical axis represents the shield factor. In FIG. 21, the horizontal axis represents the dimension t1, and the vertical axis represents the hysteresis parameter.

As described above, the value of the shield factor is preferably 22% or less. This is satisfied when the dimension t1 falls within the range shown in FIG. 20. Also, as described above, the value of the hysteresis parameter is preferably 0.22 mT or less. This is satisfied when the dimension t1 is 5 µm or less, as shown in FIG. 21. In view of these findings, the dimension t1 is preferably within the range of 0.5 to 5 µm. The dimension t2 in the Z direction of the second magnetic layer 52 is 4 µm. Therefore, the ratio of the dimension t1 in the Z direction of the first magnetic layer 51 to the dimension t2 in the Z direction of the second magnetic layer 52 is preferably within the range of 12.5% to 125%.

A reduction in the dimension in the Z direction of a magnetic layer may cause the magnetic layer to be susceptible to magnetic saturation, which may result in impairment of the function of the magnetic layer to reduce the absolute value of the first magnetic field H1. According to the embodiment, however, the provision of the second magnetic layer 52, which has the same function as the first magnetic layer 51, allows a reduction in the dimension t1 in the Z direction of the first magnetic layer 51 to a sufficient degree.

As shown in FIG. 21, with the dimension t1 ranging up to 2 µm, the value of the hysteresis parameter increases with decreasing dimension t1. This is considered to be because of the second magnetic layer 52.

Next, the results of a seventh simulation will be described. The seventh simulation investigated the effect of the gap g between the first magnetic layer 51 and the second magnetic layer 52 on the characteristics of the current sensor 1. The seventh simulation investigated the relationship between the gap g and each of the shield factor and the hysteresis parameter in the current sensor 1 of the second example. In the seventh simulation, the structural parameters shown in FIGS. 7A and 7B were set as follows. The dimension t1 was set at 3 µm. The dimension t2 was set at 4 µm. The dimension w1 was set at 30 µm. The distance d2 was set at 2.5 µm. The gap g was varied within the range of 0.1 to 10 µm.

The seventh simulation investigated the shield factor and the hysteresis parameter also on a current sensor of a third comparative example in the same manner as the current sensor 1 of the second example. In the current sensor of the third comparative example, the gap g was set at 0 µm to bring the first magnetic layer 51 and the second magnetic layer 52 into contact with each other. The other configuration of the current sensor of the third comparative example is the same as that of the current sensor 1 of the second example.

Figure 22:
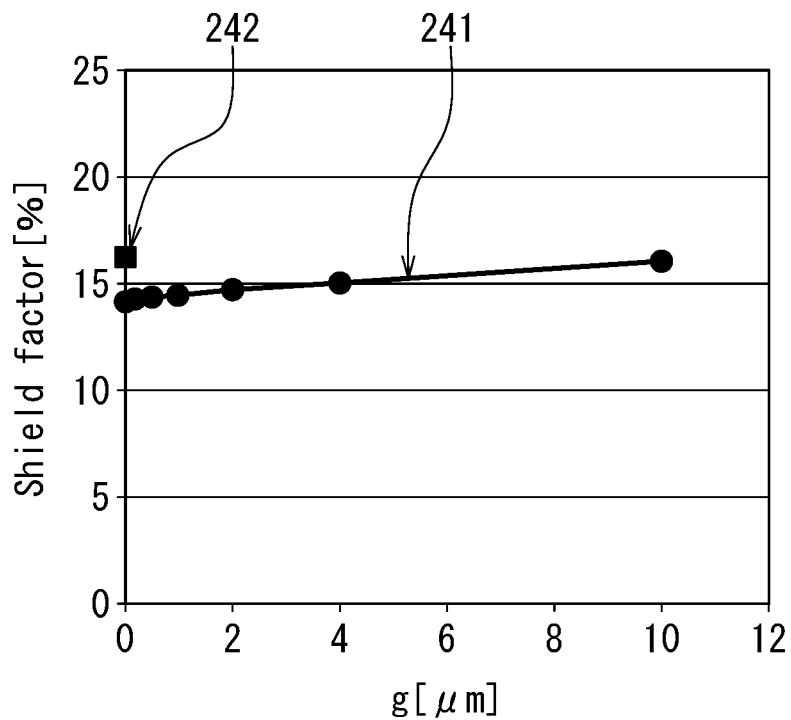
FIG. 22 is a characteristic chart illustrating the characteristic of the shield factor obtained from a seventh simulation.
Figure 23:
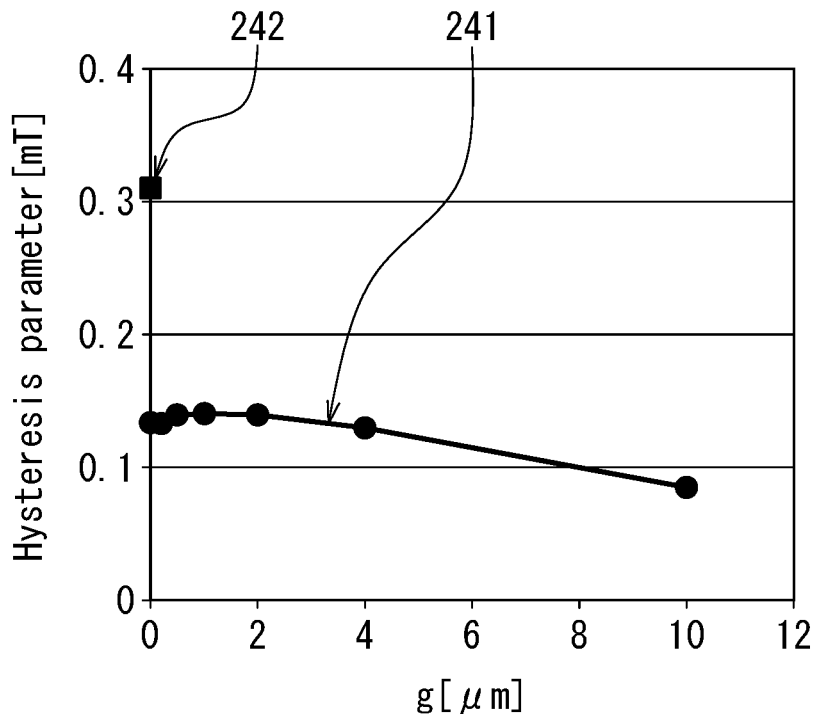
FIG. 23 is a characteristic chart illustrating the characteristic of the hysteresis parameter obtained from the seventh simulation.

FIG. 22 is a characteristic chart illustrating the shield factor obtained from the seventh simulation. FIG. 23 is a characteristic chart illustrating the hysteresis parameter obtained from the seventh simulation. In FIG. 22, the horizontal axis represents the gap g, and the vertical axis represents the shield factor. In FIG. 23, the horizontal axis represents the gap g, and the vertical axis represents the hysteresis parameter. In each of FIGS. 22 and 23, the points connected by the solid line 241 represent the characteristic of the second example, and the point 242 represents the characteristic of the third comparative example.

As described above, the value of the shield factor is preferably 22% or less. This is satisfied with the gap g within the range shown in FIG. 22. Also, as described above, the value of the hysteresis parameter is preferably 0.22 mT or less. This is satisfied with the gap g within the range shown in FIG. 23. In view of these findings, the gap g preferably falls within the range of 0.1 to 10 μm. The lower limit of this range, 0.1 μm, corresponds to a minimum dimension in the Z direction of the nonmagnetic layer 66, which is interposed between the first magnetic layer 51 and the second magnetic layer 52, that can be formed in a stable manner.

As shown in FIG. 23, the third comparative example (see the reference numeral 242) shows a larger value of hysteresis parameter compared with the second example (see the reference numeral 241). This is because bringing the first and second magnetic layers 51 and 52 into contact with each other makes the two magnetic layers into substantially a single magnetic layer, thus making the two magnetic layers 51 and 52 to become unable to provide their effect of reducing the value of hysteresis parameter.

Another effect of this embodiment will now be described. In this embodiment, the coil 11, the magnetic sensor 12, the first magnetic layer 51 and the second magnetic layer 52 are integrated with each other and are independent of the bus bar 2. The embodiment thus makes it possible to configure the current sensor 1 and the magnetic sensor device 50 independent of the bus bar 2.

The present invention is not limited to the foregoing embodiment, and various modifications may be made thereto. For example, the magnetic sensor 12 may include, in place of the magnetoresistive elements, any elements that are other than magnetoresistive elements and configured to detect a magnetic field, such as Hall elements.

Further, the magnetic sensor 12, the first magnetic layer 51 and the second magnetic layer 52 may be arranged in this order in the −Z direction. In such a case, the second magnetic layer 52 is located between the first magnetic layer 51 and the substrate 61. The coil 11 and the magnetic sensor 12 are located above the first magnetic layer 51.

The current sensor 1 may include a first pair of first and second magnetic layers 51 and 52 disposed above the coil 11 and the magnetic sensor 12, and a second pair of first and second magnetic layers 51 and 52 disposed below the coil 11 and the magnetic sensor 12. The first pair of first and second magnetic layers 51 and 52 correspond to the first and second magnetic layers 51 and 52 of the embodiment. The first magnetic layer 51 of the second pair of first and second magnetic layers 51 and 52 is located closer to the magnetic sensor 12 than is the second magnetic layer 52 of the second pair of first and second magnetic layers 51 and 52.

Obviously, many modifications and variations of the present invention are possible in the light of the above teachings. Thus, it is to be understood that, within the scope of the appended claims and equivalents thereof, the invention may be practiced in other embodiments than the foregoing most preferable embodiment.

What is claimed is:

1. A magnetic sensor device for use in a current sensor for detecting a value of a current to be detected, comprising:
   a magnetic sensor;
   a first magnetic layer;
   a second magnetic layer in non-contact with the first magnetic layer;
   a nonmagnetic layer between the first magnetic layer and the second magnetic layer; and
   a substrate, wherein
   the magnetic sensor, the first magnetic layer, and the second magnetic layer are arranged (1) in an order of the magnetic sensor, the first magnetic layer and the second magnetic layer, (2) such that a straight line passes through the magnetic sensor, the first magnetic layer and the second magnetic layer and (3) so that different portions of magnetic flux generated by the current to be detected pass through the magnetic sensor, the first magnetic layer, and the second magnetic layer,
   the magnetic sensor, the first magnetic layer, and the second magnetic layer are fixed on the substrate,
   the nonmagnetic layer is a conductor and is in contact with the second magnetic layer, and
   a gap between the first magnetic layer and the second magnetic layer in a direction of the straight line is between 0.1 and 10 μm.

2. The magnetic sensor device according to claim 1, wherein the magnetic sensor includes a magnetoresistive element.

3. The magnetic sensor device according to claim 1, wherein the magnetic sensor is configured to detect a magnetic field in a second direction orthogonal to the straight line.

4. The magnetic sensor device according to claim 3, wherein each of the first magnetic layer and the second magnetic layer has a first dimension in the direction of the straight line, and a second dimension in the second direction, the second dimension being greater than the first dimension.

5. The magnetic sensor device according to claim 4, wherein the first magnetic layer is smaller in the second dimension than the second magnetic layer.

6. The magnetic sensor device according to claim 4, wherein the first magnetic layer is smaller in volume than the second magnetic layer.

7. The magnetic sensor device according to claim 6, wherein the first magnetic layer is smaller in at least one of the first and second dimensions than the second magnetic layer.

8. The magnetic sensor device according to claim 3, wherein each of the first magnetic layer and the second magnetic layer has a first dimension in the direction of the straight line, a second dimension in the second direction, and a third dimension in a third direction orthogonal to the direction of the straight line and the second direction, the third dimension being greater than the second dimension.

9. The magnetic sensor device according to claim 8, wherein the third dimension of the first magnetic layer is smaller than or equal to the third dimension of the second magnetic layer.

10. The magnetic sensor device according to claim 1, wherein the first magnetic layer is lower in coercivity than the second magnetic layer.

11. The magnetic sensor device according to claim 1, wherein the magnetic sensor, the first magnetic layer, and the second magnetic layer are integrated with each other and independent of a conductor through which the current to be detected flows.

12. A current sensor comprising:
   a coil for generating a second magnetic field for canceling out a first magnetic field generated by a current to be detected;
   a magnetic sensor for detecting a composite magnetic field of the first and second magnetic fields as a magnetic field to be detected, and generating a magnetic-field detection value dependent on a strength of the magnetic field to be detected;
   a feedback circuit for controlling, in accordance with the magnetic-field detection value, a feedback current to be used to generate the second magnetic field, and passing the feedback current through the coil;
   a current detector for generating a detection value of the feedback current;
   a first magnetic layer;

a second magnetic layer in non-contact with the first magnetic layer;

a nonmagnetic layer between the first magnetic layer and the second magnetic layer; and a substrate, wherein the magnetic sensor, the first magnetic layer, and the second magnetic layer are arranged (1) in an order of the magnetic sensor, the first magnetic layer and the second magnetic layer, (2) such that a straight line passes through the magnetic sensor, the first magnetic layer and the second magnetic layer and (3) so that different portions of magnetic flux generated by the current to be detected pass through the magnetic sensor, the first magnetic layer, and the second magnetic layer, the coil, the magnetic sensor, the first magnetic layer and the second magnetic layer are fixed on the substrate, the nonmagnetic layer is a conductor and is in contact with the second magnetic layer, and a gap between the first magnetic layer and the second magnetic layer in a direction of the straight line is between 0.1 and 10 µm.

13. The current sensor according to claim 12, wherein the magnetic sensor includes a magnetoresistive element.

14. The current sensor according to claim 12, wherein the magnetic sensor is configured to detect a magnetic field in a second direction orthogonal to the straight line.

15. The current sensor according to claim 14, wherein each of the first magnetic layer and the second magnetic layer has a first dimension in the direction of the straight line, and a second dimension in the second direction, the second dimension being greater than the first dimension.

16. The current sensor according to claim 15, wherein the first magnetic layer is smaller in the second dimension than the second magnetic layer.

17. The current sensor according to claim 15, wherein the first magnetic layer is smaller in volume than the second magnetic layer.

18. The current sensor according to claim 17, wherein the first magnetic layer is smaller in at least one of the first and second dimensions than the second magnetic layer.

19. The current sensor according to claim 14, wherein each of the first magnetic layer and the second magnetic layer has a first dimension in the direction of the straight line, a second dimension in the second direction, and a third dimension in a third direction orthogonal to the direction of the straight line and the second direction, the third dimension being greater than the second dimension.

20. The current sensor according to claim 19, wherein the third dimension of the first magnetic layer is smaller than or equal to the third dimension of the second magnetic layer.

21. The current sensor according to claim 12, wherein the first magnetic layer is lower in coercivity than the second magnetic layer.

22. The current sensor according to claim 12, wherein the coil is located on an opposite side of the first magnetic layer from the second magnetic layer.

23. The current sensor according to claim 12, wherein the coil, the magnetic sensor, the first magnetic layer, and the second magnetic layer are integrated with each other and independent of a conductor through which the current to be detected flows.

* * * * *